United States Patent
Takaki et al.

(10) Patent No.: US 10,707,314 B2
(45) Date of Patent: Jul. 7, 2020

(54) SURROUND GATE VERTICAL FIELD EFFECT TRANSISTORS INCLUDING TUBULAR AND STRIP ELECTRODES AND METHOD OF MAKING THE SAME

(71) Applicant: SANDISK TECHNOLOGIES LLC, Plano, TX (US)

(72) Inventors: Seje Takaki, Yokkaichi (JP); Jongsun Sel, Los Gatos, CA (US); Hisakazu Otoi, Yokkaichi (JP); Chao Feng Yeh, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 14 days.

(21) Appl. No.: 15/720,490

(22) Filed: Sep. 29, 2017

(65) Prior Publication Data

US 2019/0103467 A1 Apr. 4, 2019

(51) Int. Cl.
*H01L 29/788* (2006.01)
*H01L 29/417* (2006.01)
(Continued)

(52) U.S. Cl.
CPC .... *H01L 29/41741* (2013.01); *H01L 27/0207* (2013.01); *H01L 27/1112* (2013.01); *H01L 27/249* (2013.01); *H01L 27/2454* (2013.01); *H01L 29/66666* (2013.01); *H01L 29/7827* (2013.01); *H01L 45/06* (2013.01);
(Continued)

(58) Field of Classification Search
None
See application file for complete search history.

(56) References Cited

U.S. PATENT DOCUMENTS 5,915,167 A 6/1999 Leedy
7,701,746 B2 4/2010 Meeks et al.
(Continued)

FOREIGN PATENT DOCUMENTS

WO WO2007004843 A1 1/2007

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Abul Kalam
(74) *Attorney, Agent, or Firm* — The Marbury Law Group, PLLC

(57) ABSTRACT

A stack including doped semiconductor strips, a one-dimensional array of gate electrode strips, and a dielectric matrix layer is formed over a substrate. A two-dimensional array of openings is formed through the dielectric matrix layer and the one-dimensional array of gate electrode strips. A two-dimensional array of tubular gate electrode portions is formed in the two-dimensional array of openings. Each of the tubular gate electrode portions is formed directly on a respective one of the gate electrode strips. Gate dielectrics are formed on inner sidewalls of the tubular gate electrode portions. Vertical semiconductor channels are formed within each of the gate dielectrics by deposition of a semiconductor material. A two-dimensional array of vertical field effect transistors including surrounding gate electrodes is formed.

13 Claims, 41 Drawing Sheets

(51) Int. Cl.
  *H01L 27/02* (2006.01)
  *H01L 27/11* (2006.01)
  *H01L 27/24* (2006.01)
  *H01L 45/00* (2006.01)
  *H01L 29/78* (2006.01)
  *H01L 29/66* (2006.01)

(52) U.S. Cl.
  CPC .......... *H01L 45/08* (2013.01); *H01L 45/1233* (2013.01); *H01L 45/146* (2013.01); *H01L 45/16* (2013.01); *H01L 2221/00* (2013.01); *H01L 2227/00* (2013.01); *H01L 2229/00* (2013.01)

(56) References Cited

U.S. PATENT DOCUMENTS

| | | |
|---|---|---|
| 7,764,534 B2 | 7/2010 | Thorp et al. |
| 9,331,088 B2 | 5/2016 | Takaki |
| 9,343,507 B2 | 5/2016 | Takaki |
| 9,437,658 B2 | 9/2016 | Sakotsubo |
| 9,583,615 B2 | 2/2017 | Chen et al. |
| 2009/0197379 A1* | 8/2009 | Leslie .............. H01L 27/10876 438/253 |
| 2013/0043455 A1 | 2/2013 | Bateman |
| 2017/0141161 A1 | 5/2017 | Sakotsubo |

OTHER PUBLICATIONS

U.S. Appl. No. 15/400,244, filed Jan. 6, 2017, SanDisk Technologies LLC.
U.S. Appl. No. 15/632,773, filed Jun. 26, 2017, SanDisk Technologies LLC.
U.S. Appl. No. 15/633,092, filed Jun. 26, 2017, SanDisk Technologies LLC.
U.S. Appl. No. 15/672,929, filed Aug. 9, 2017, SanDisk Technologies LLC.
U.S. Appl. No. 15/711,075, filed Sep. 21, 2017, SanDisk Technologies LLC.
U.S. Appl. No. 15/715,532, filed Sep. 26, 2017, SanDisk Technologies LLC.

* cited by examiner

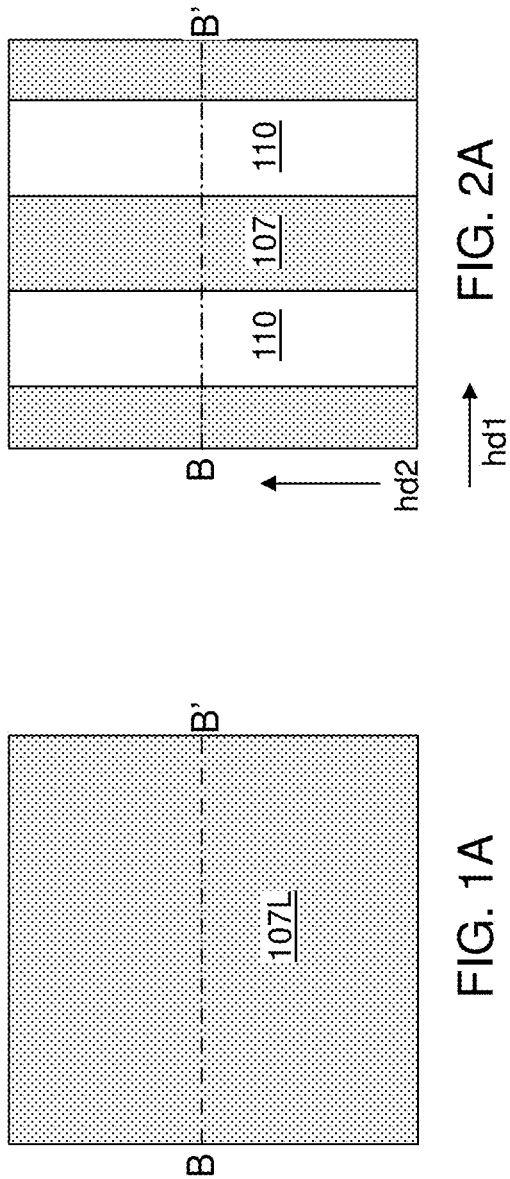
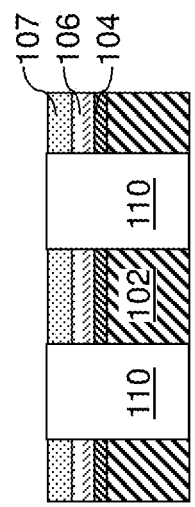
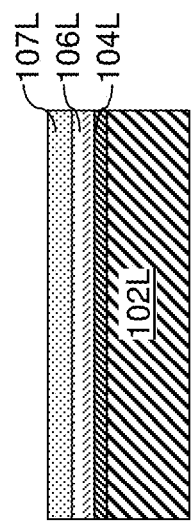
FIG. 1A
FIG. 1B
FIG. 2A
FIG. 2B

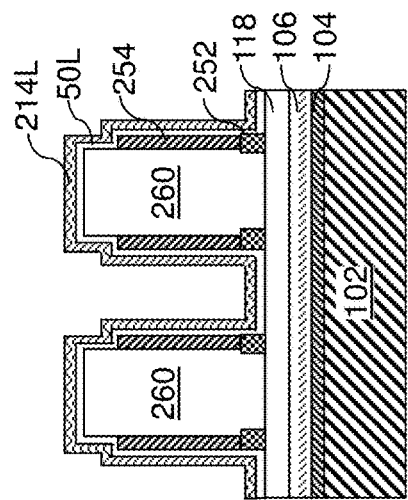
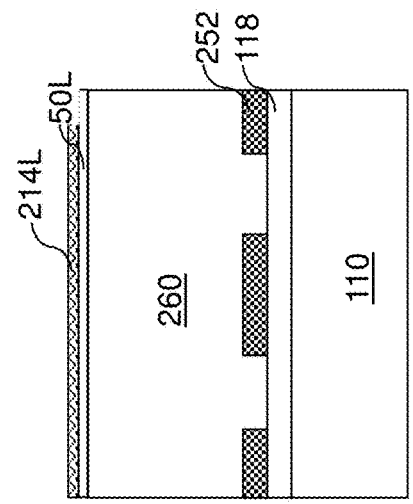
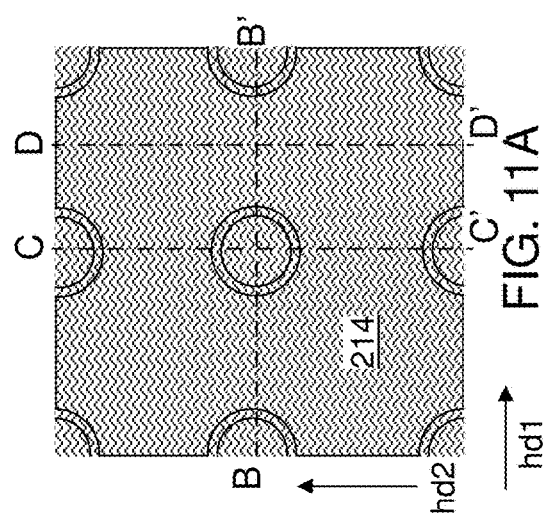
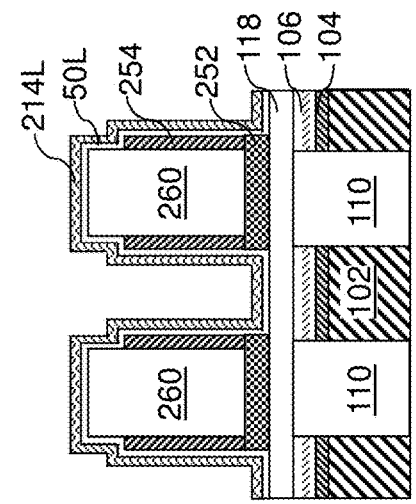

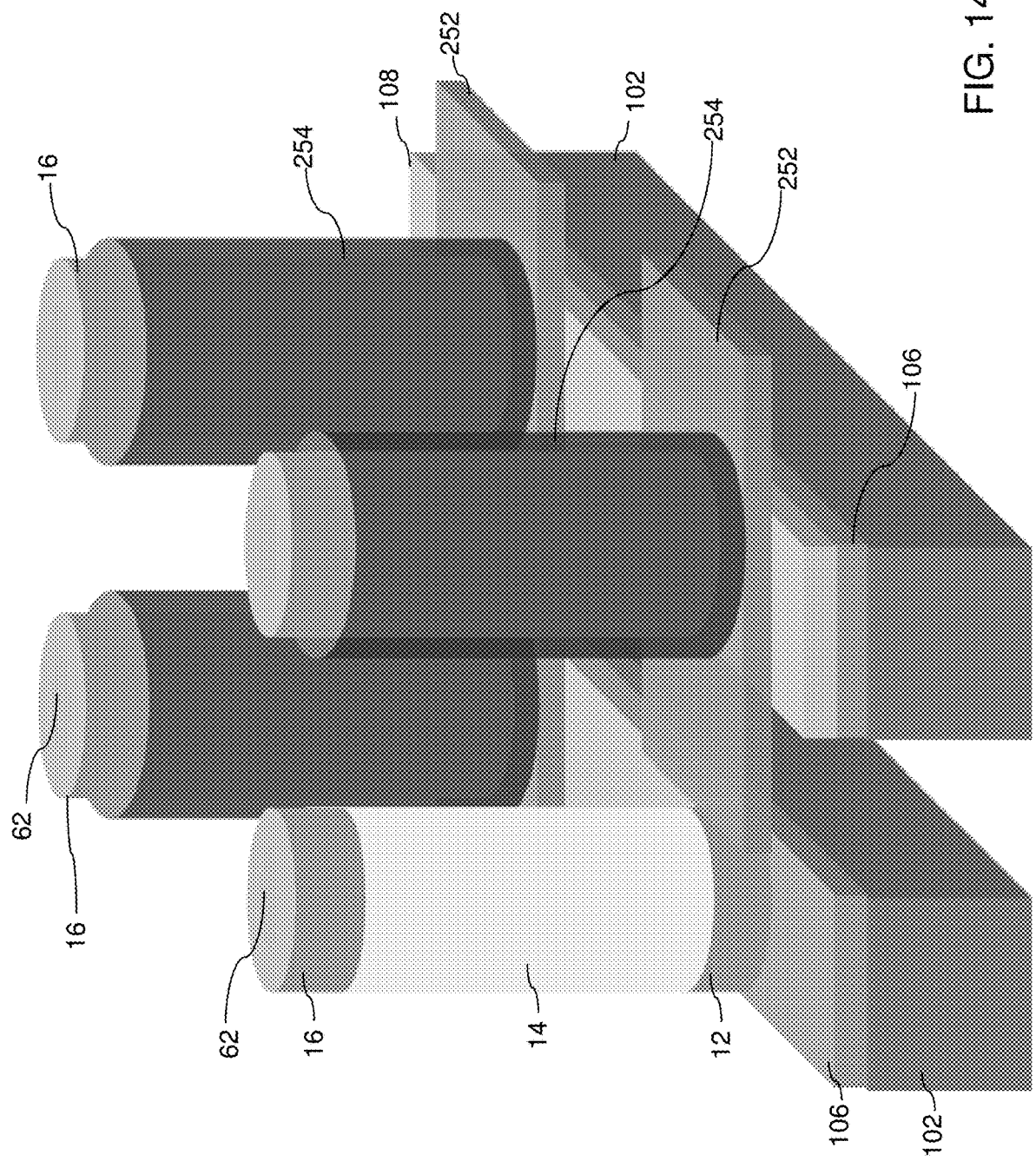

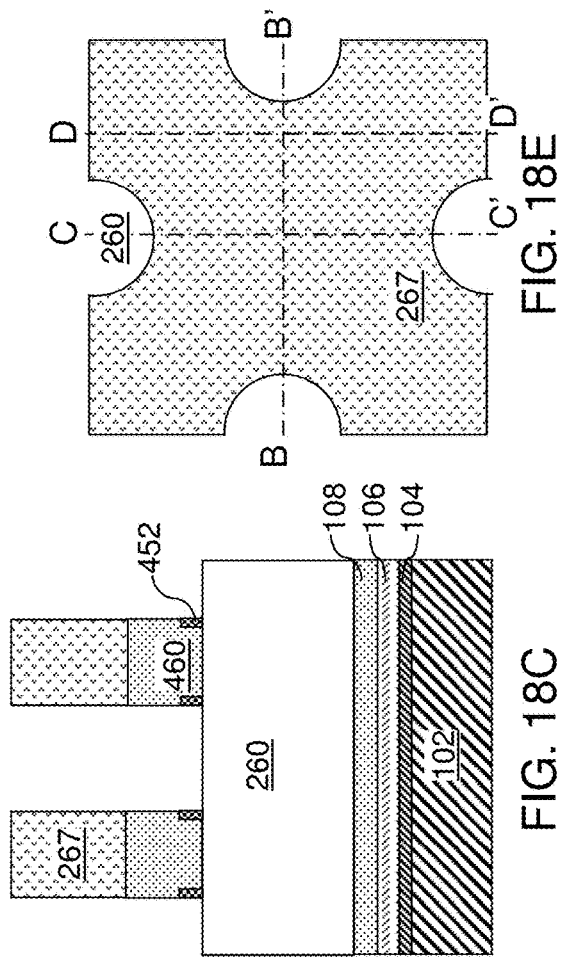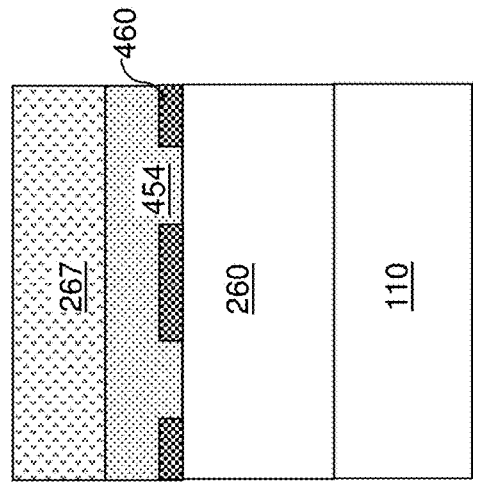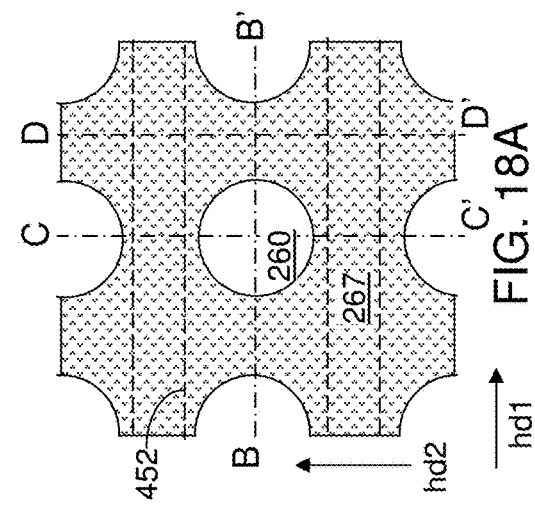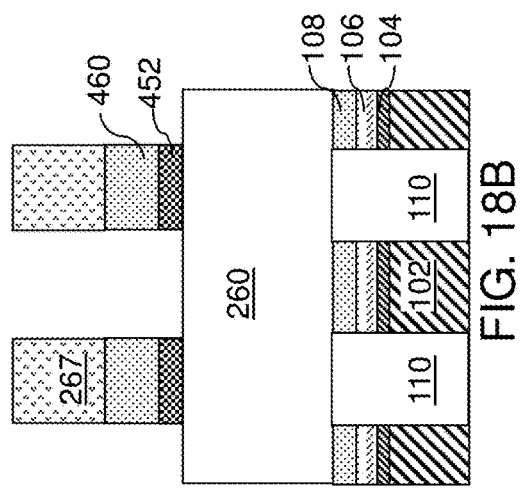
FIG. 18A  FIG. 18B  FIG. 18C  FIG. 18D  FIG. 18E

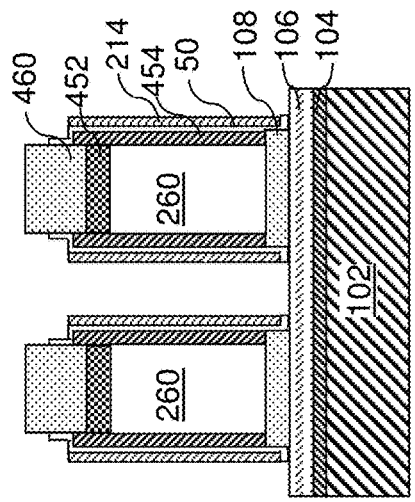
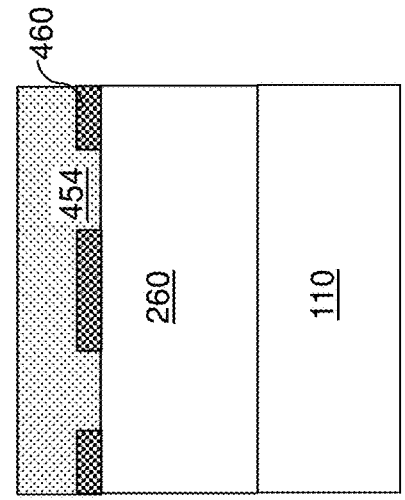
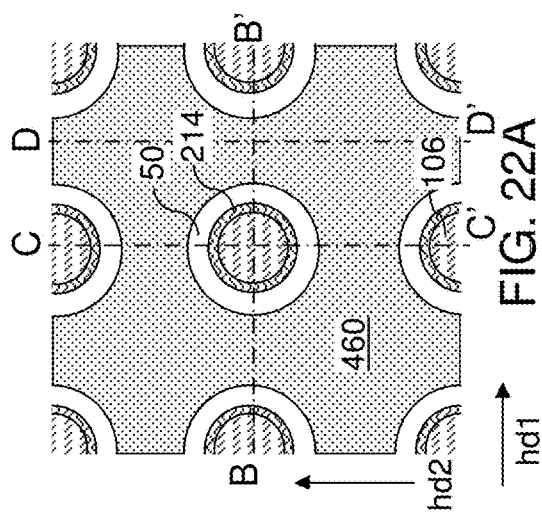
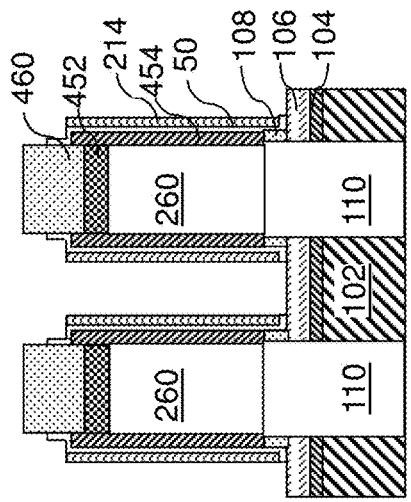

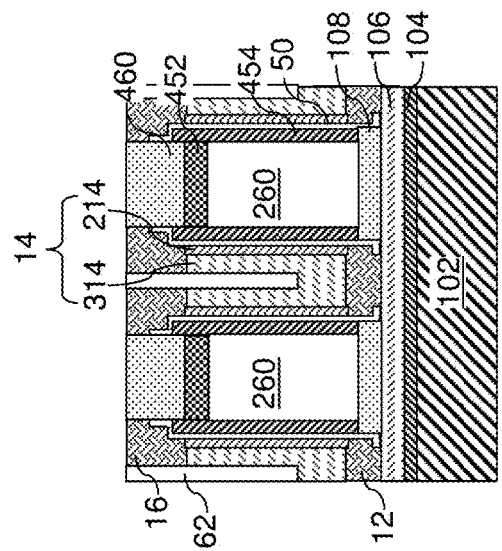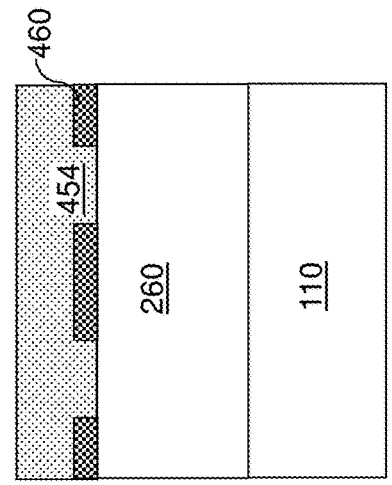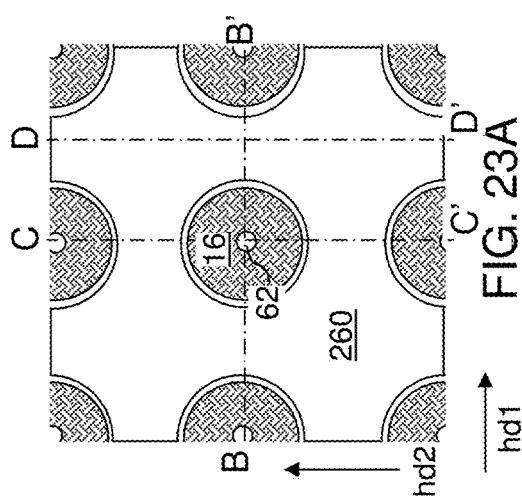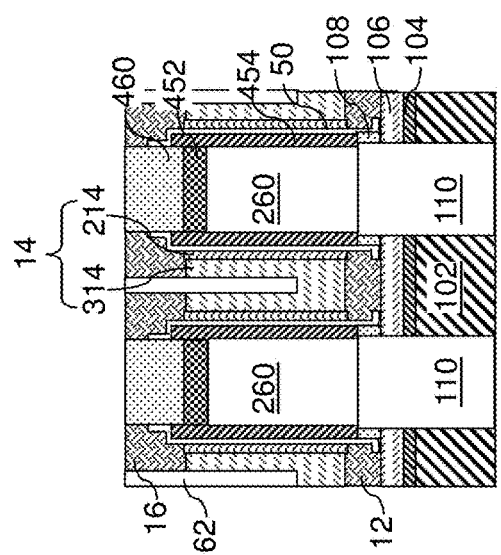

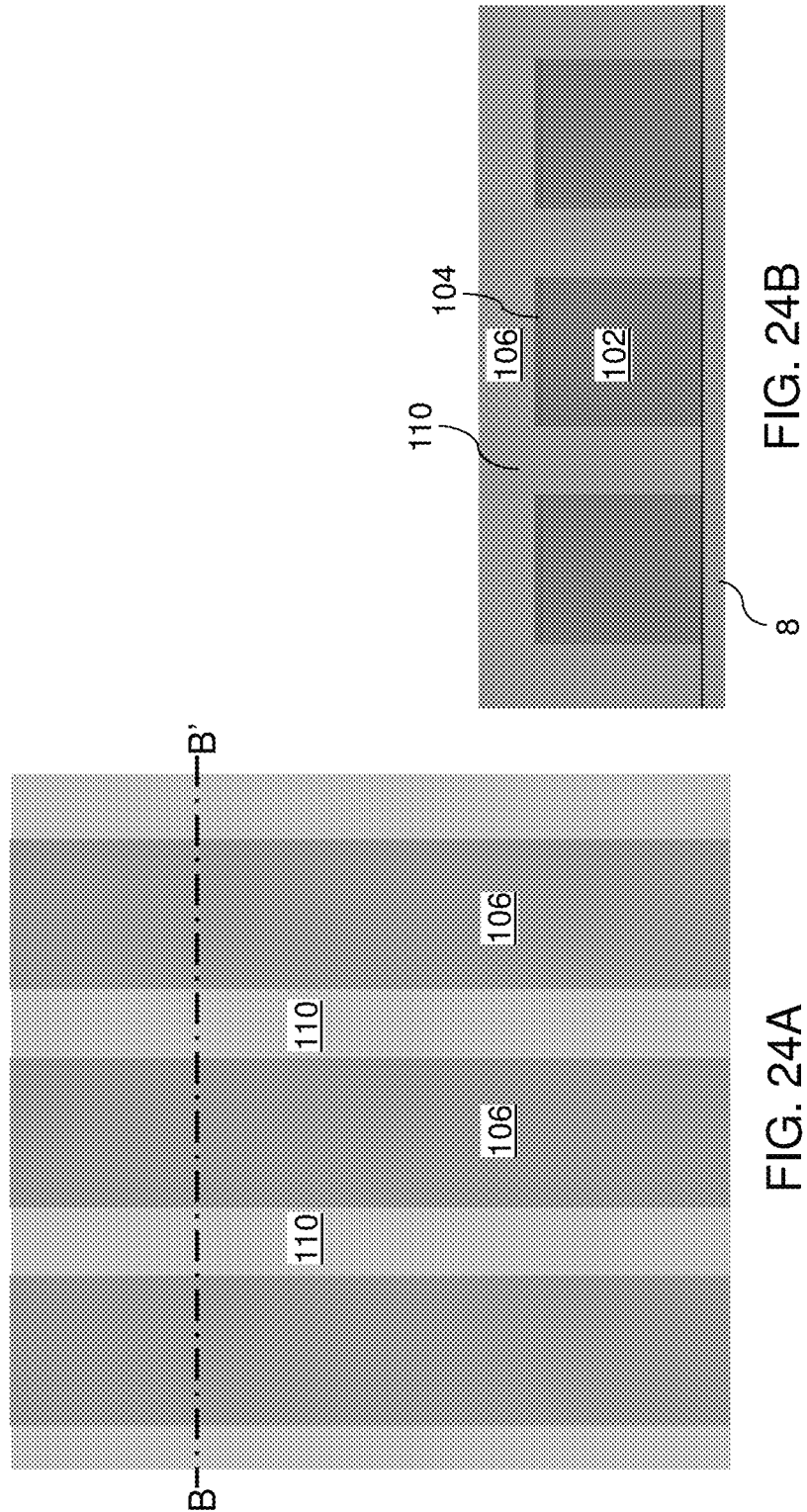

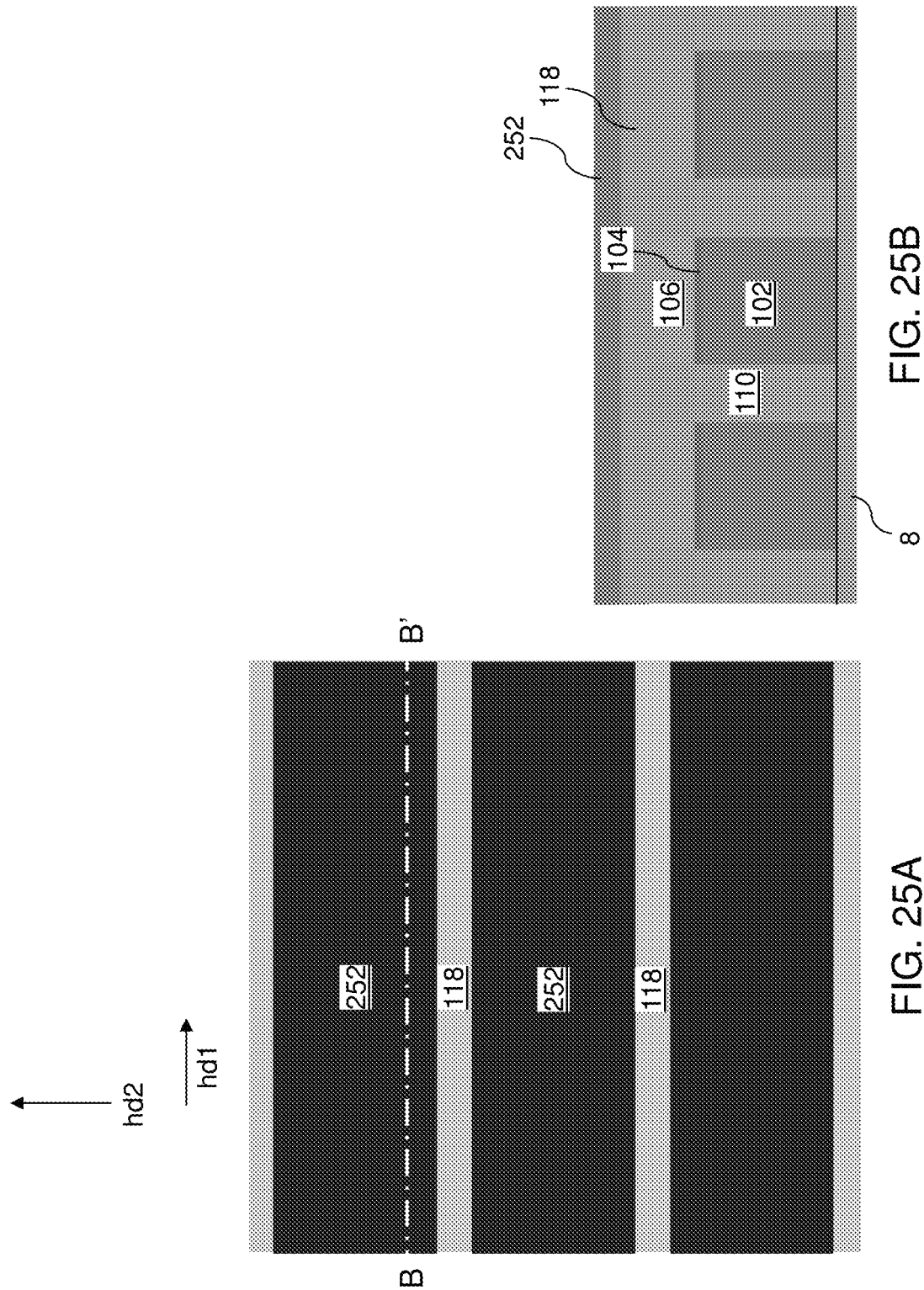

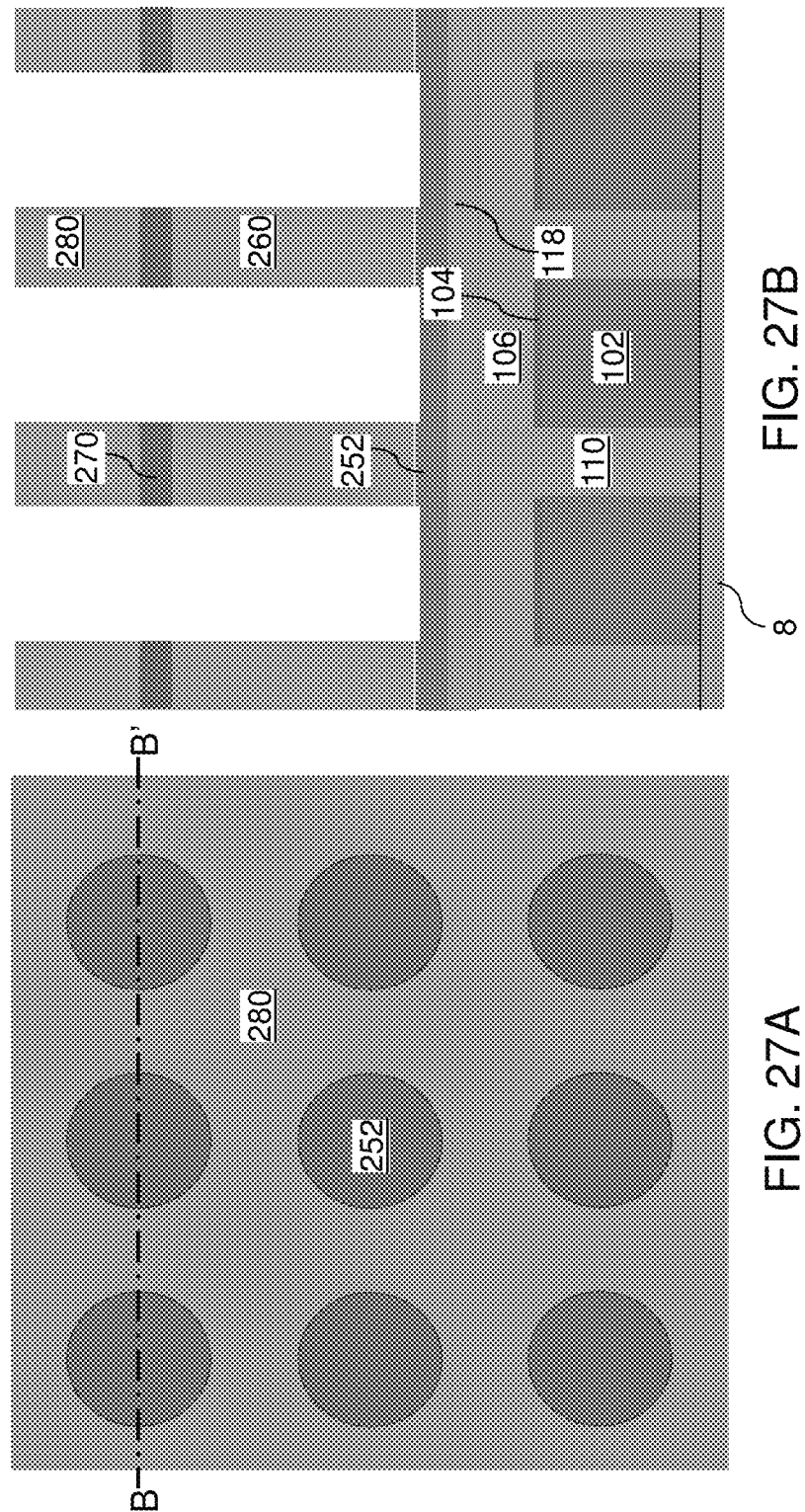

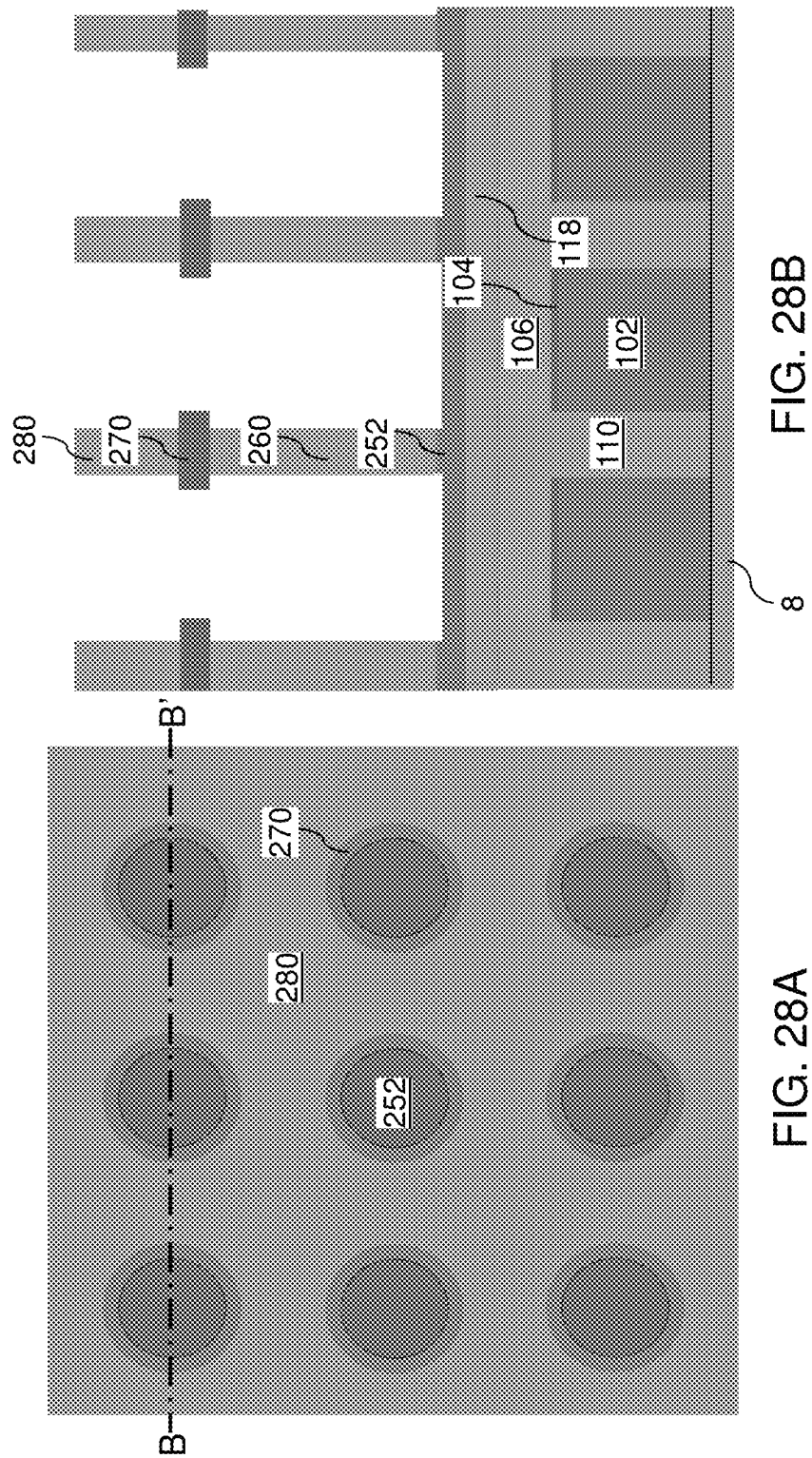

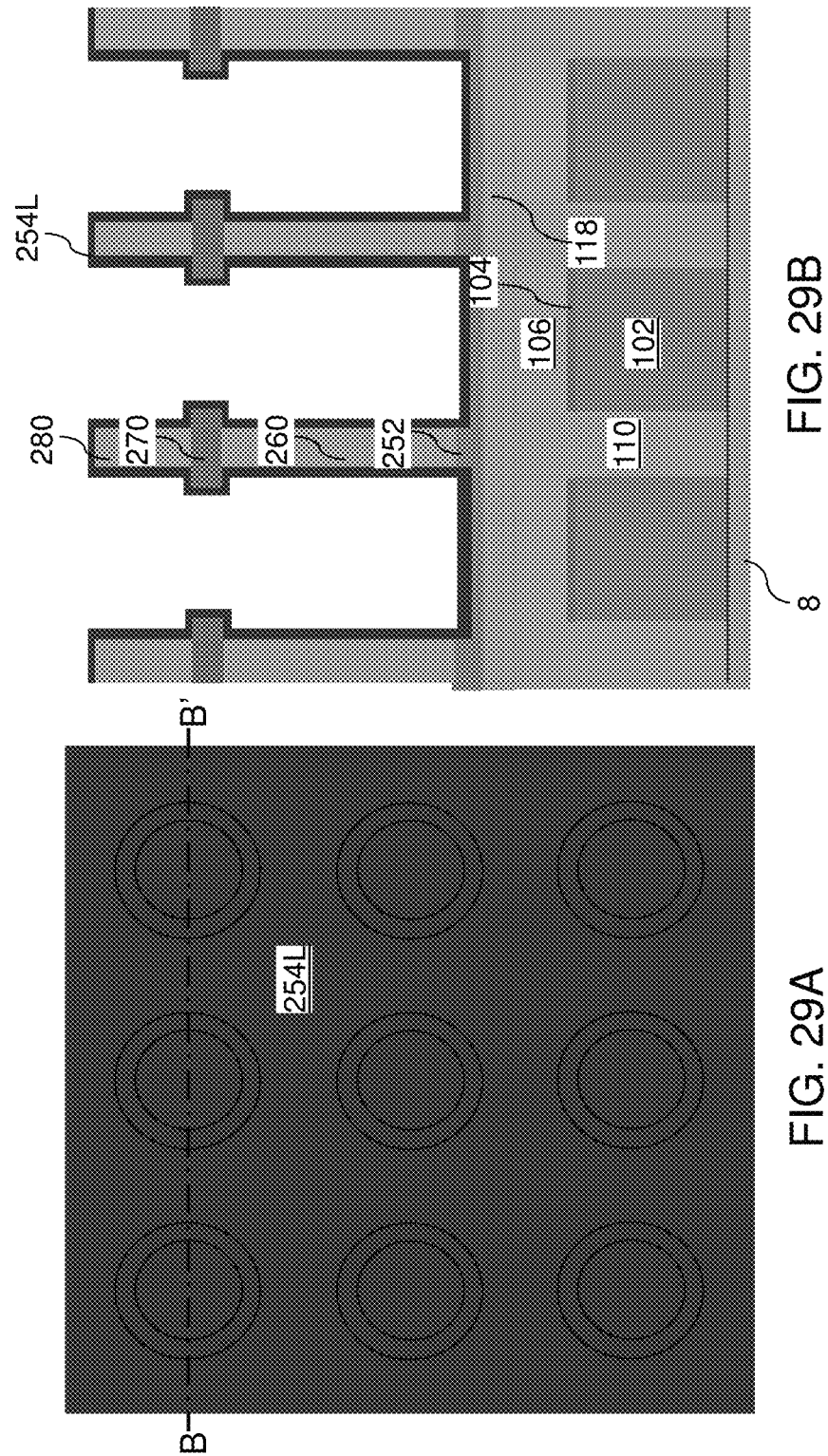

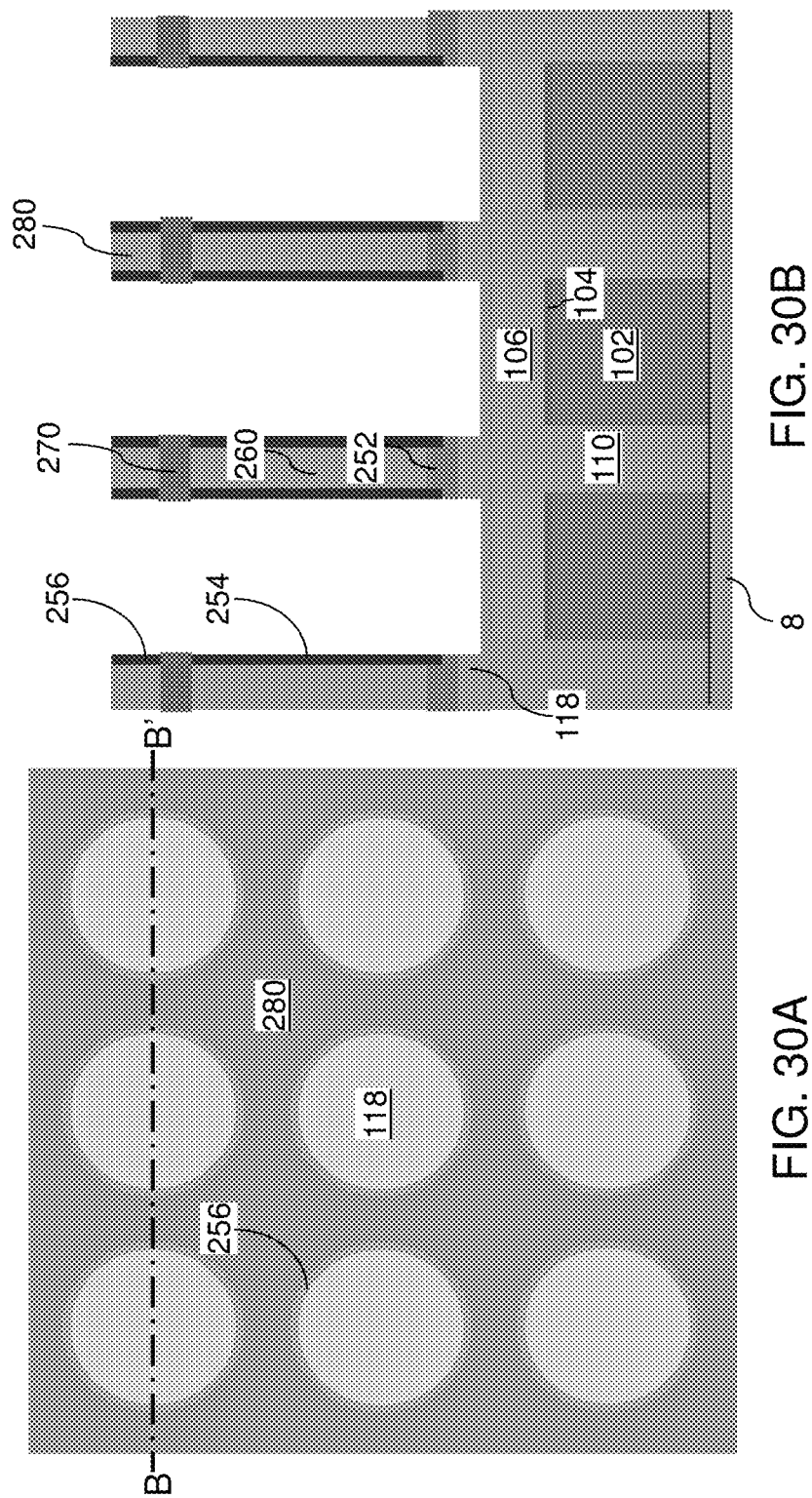

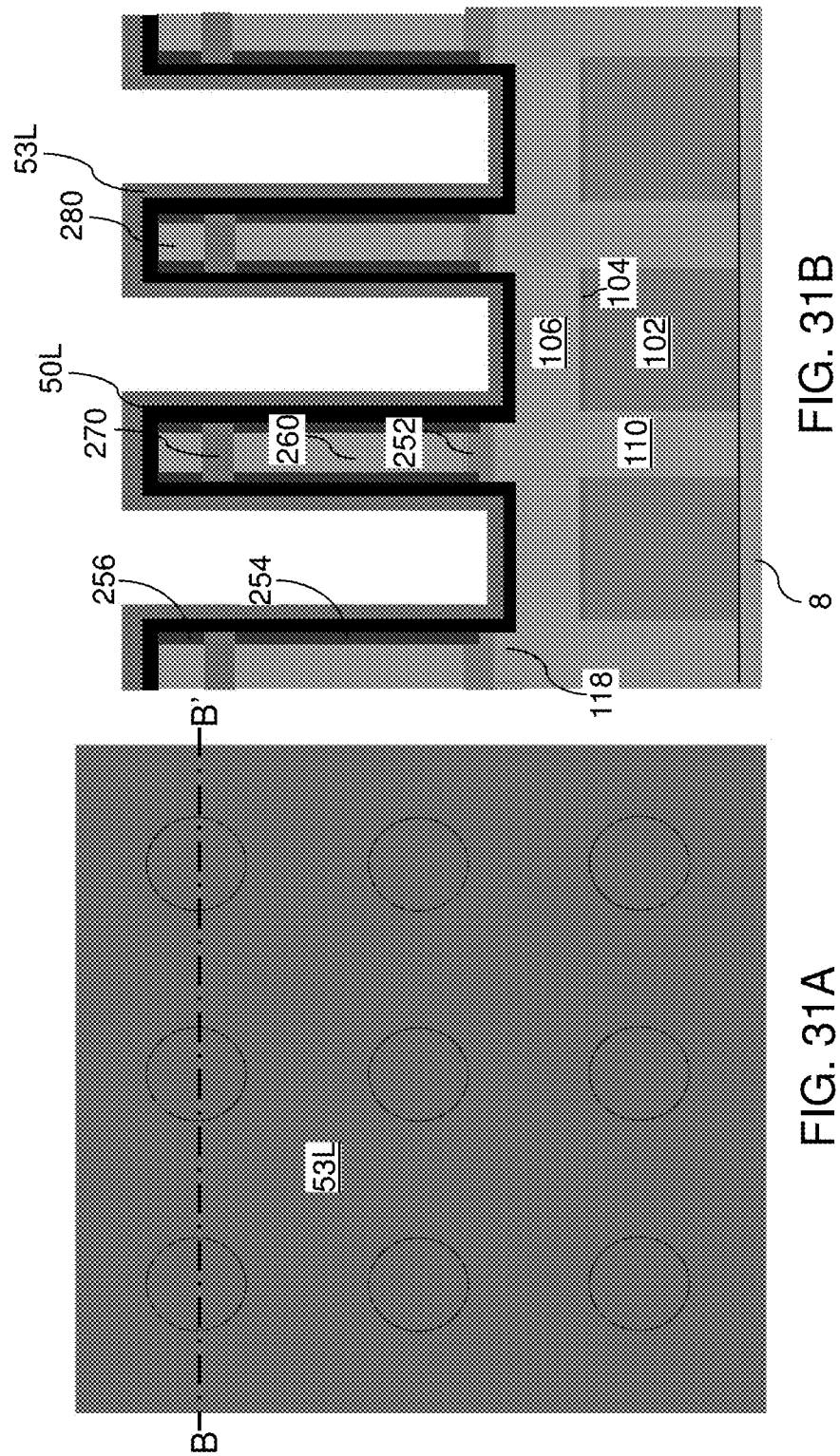

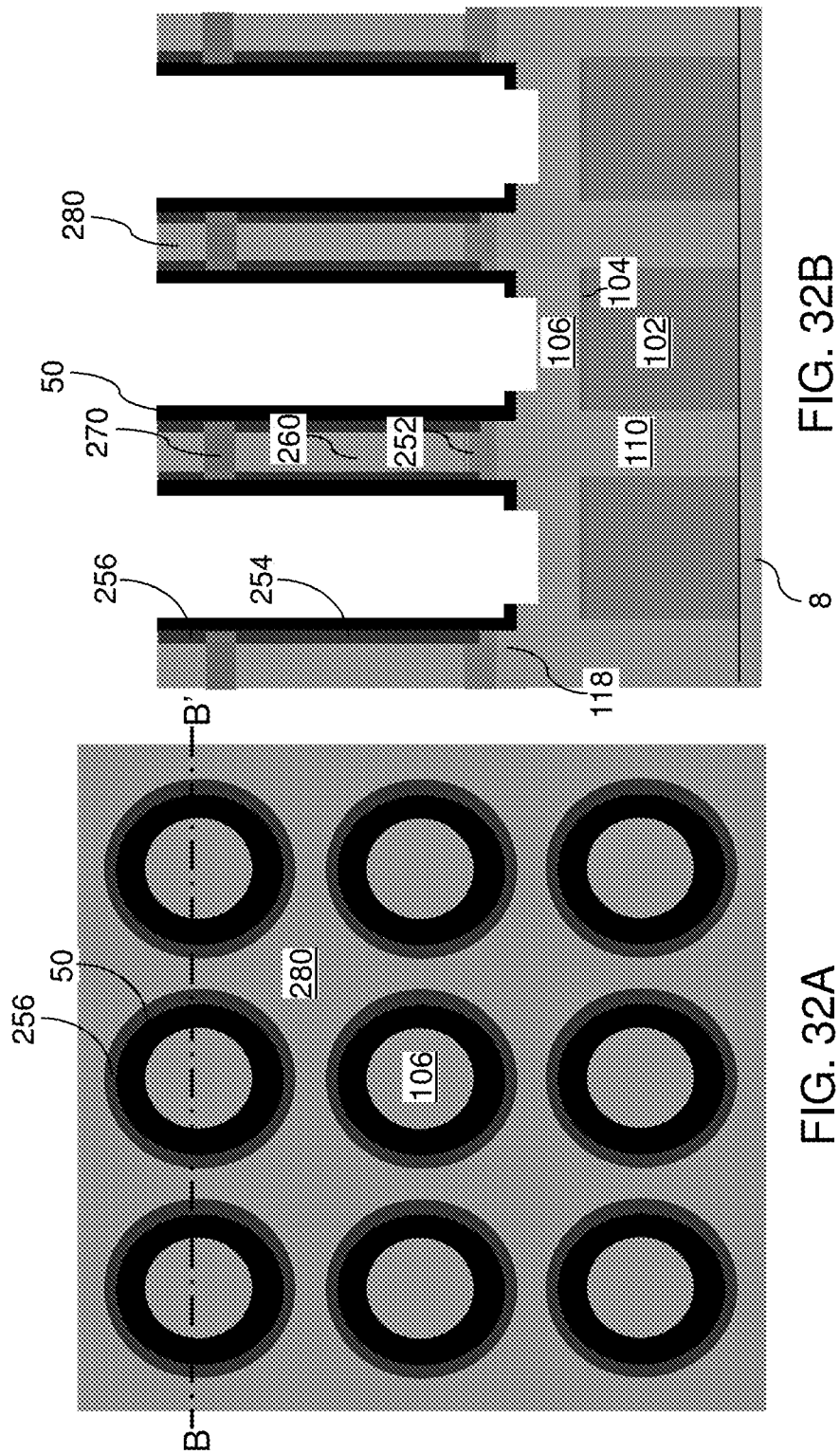

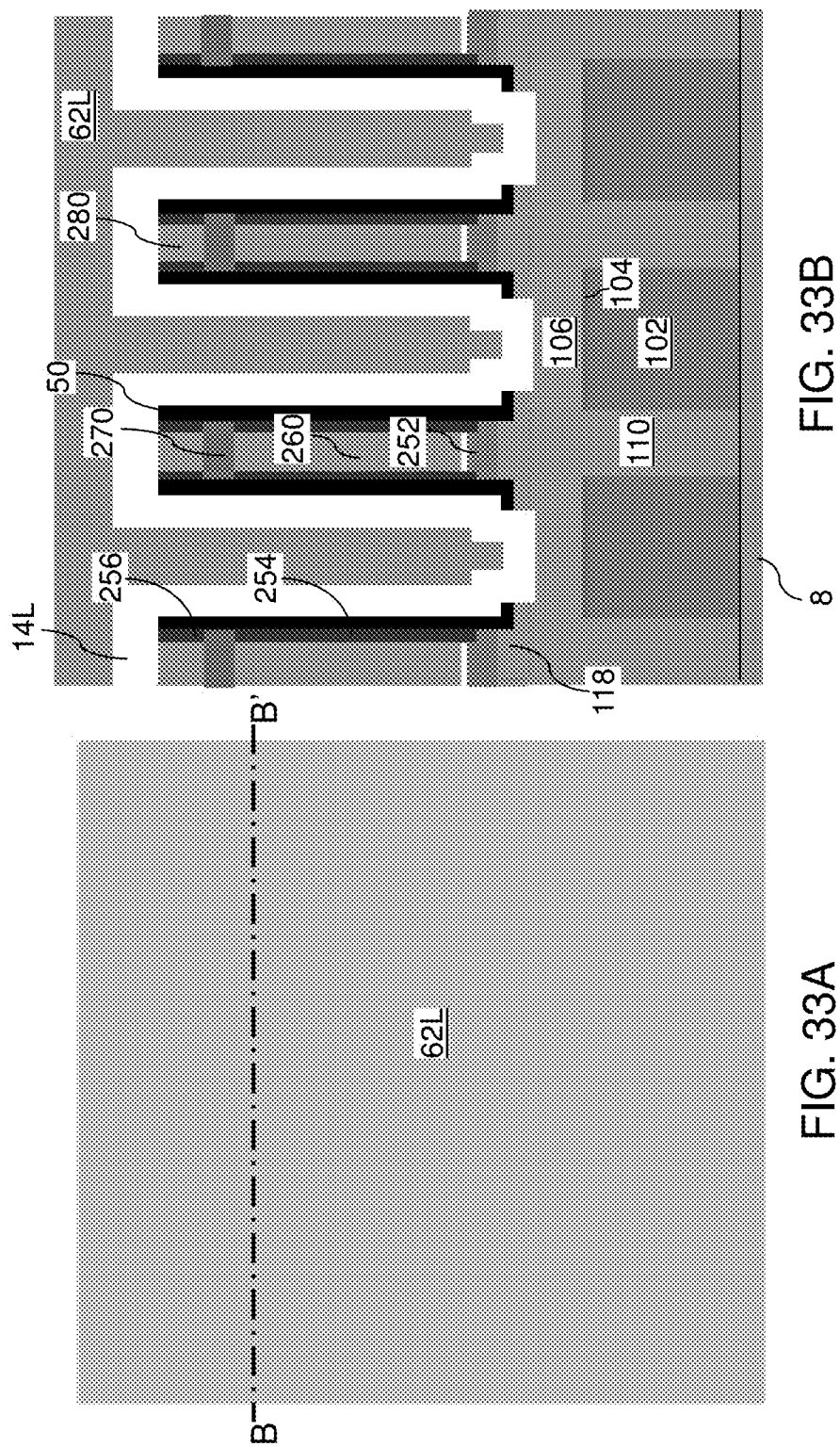

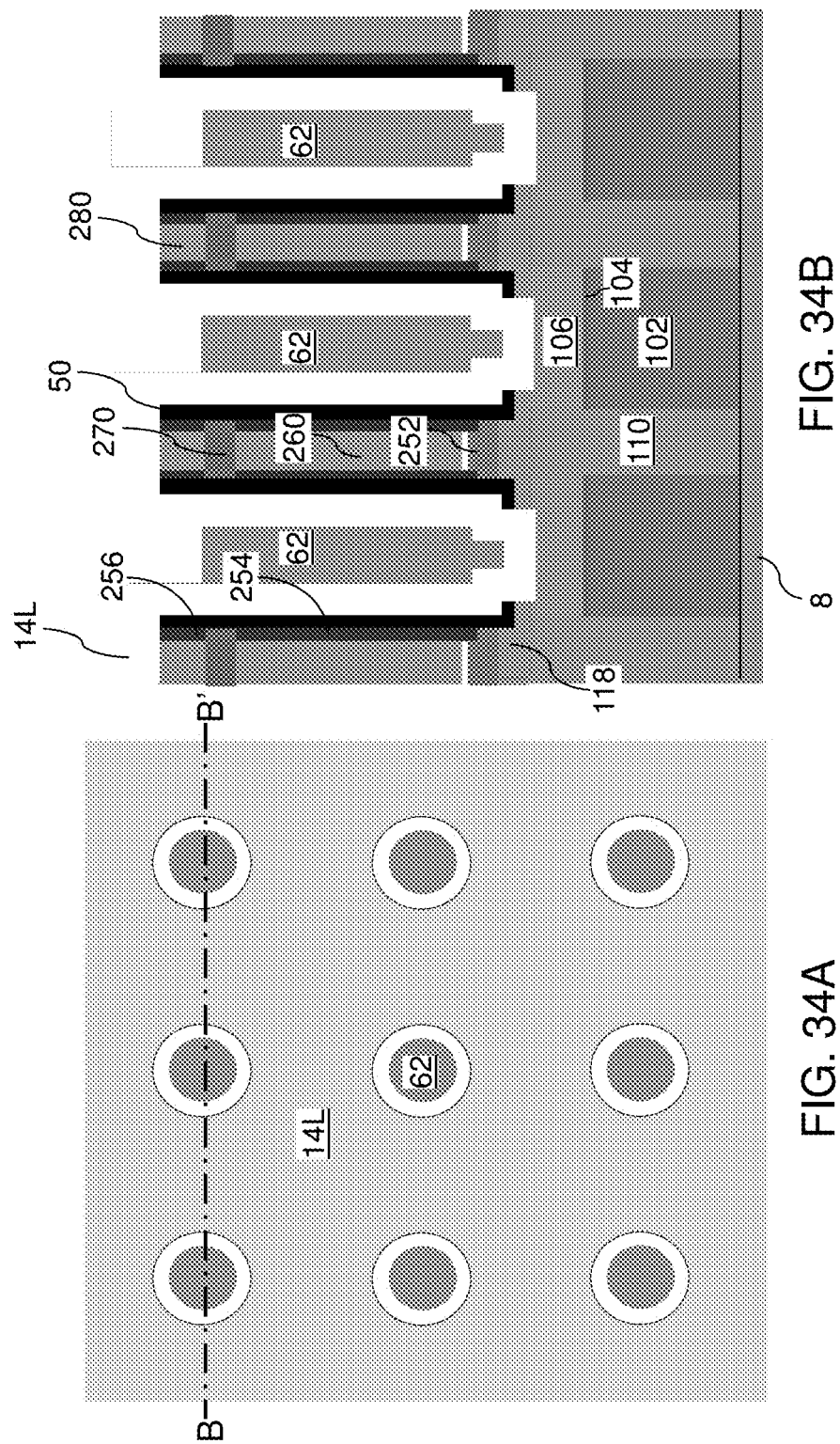

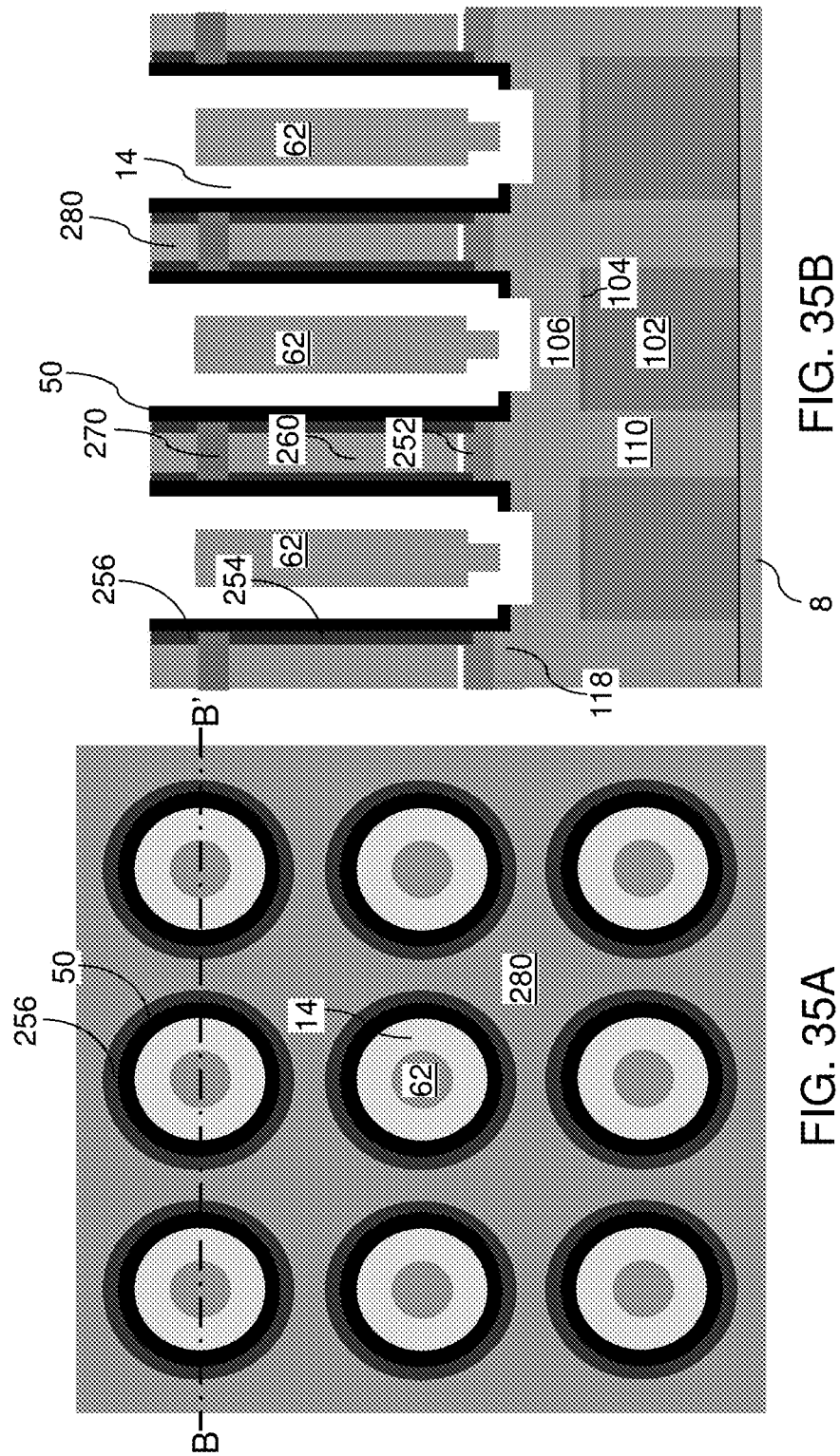

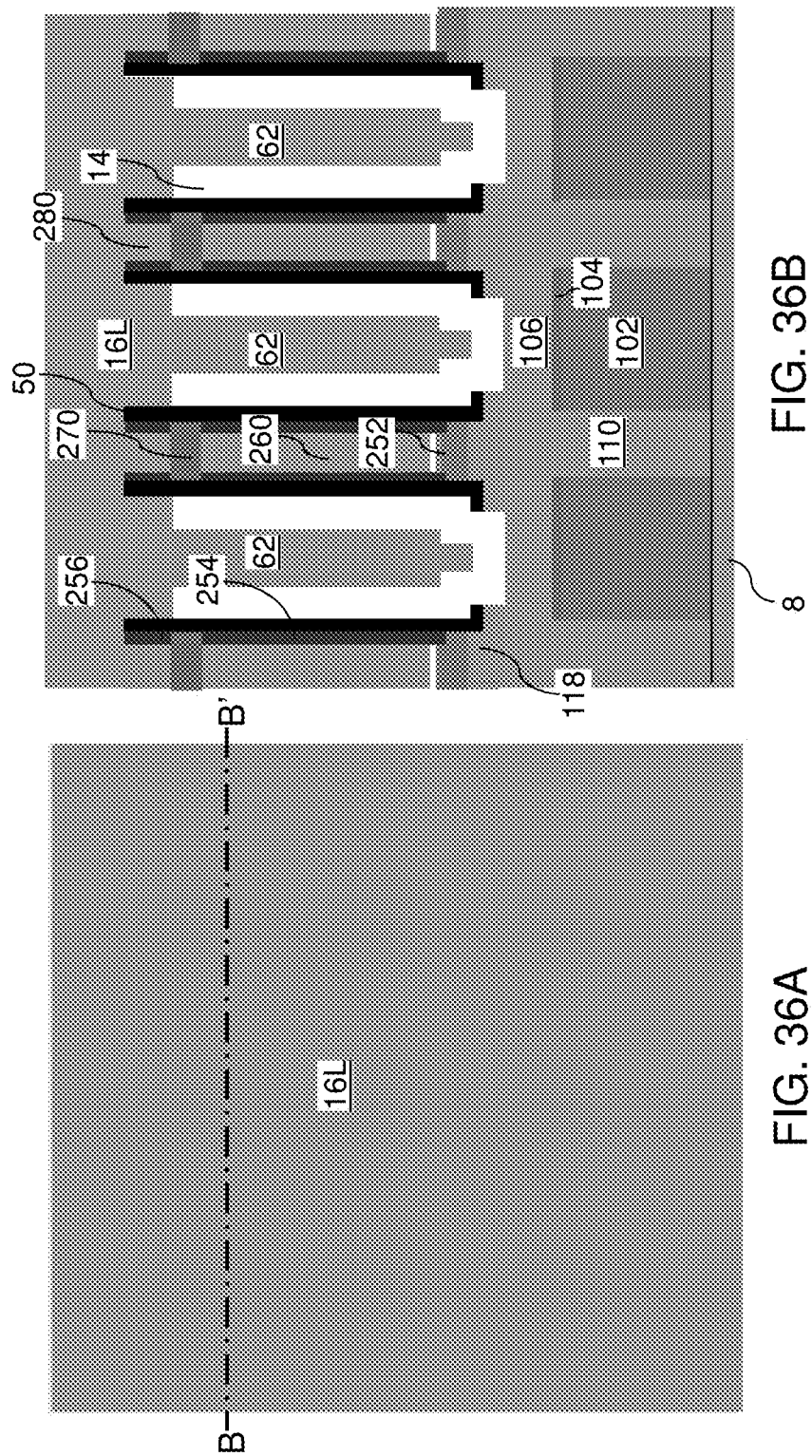

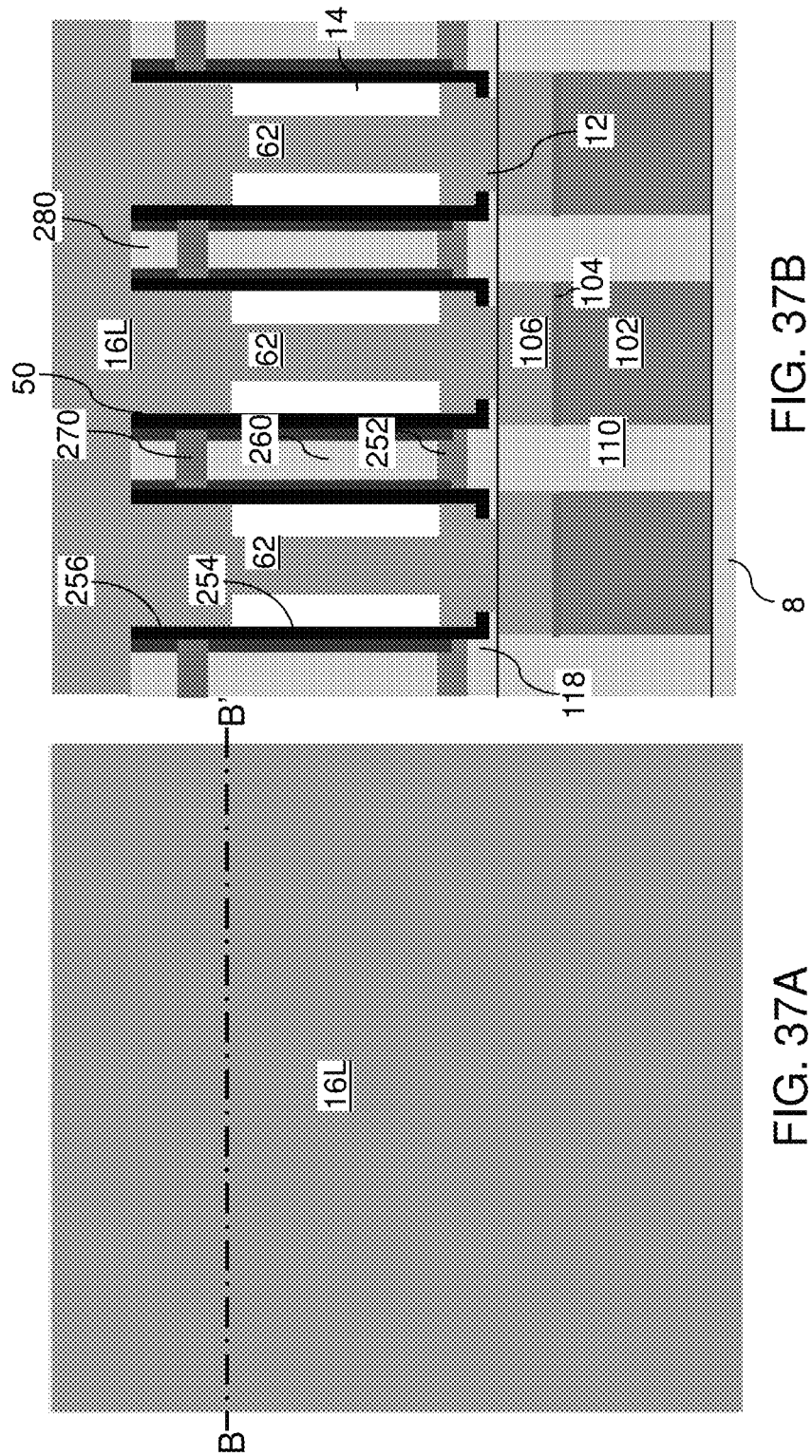

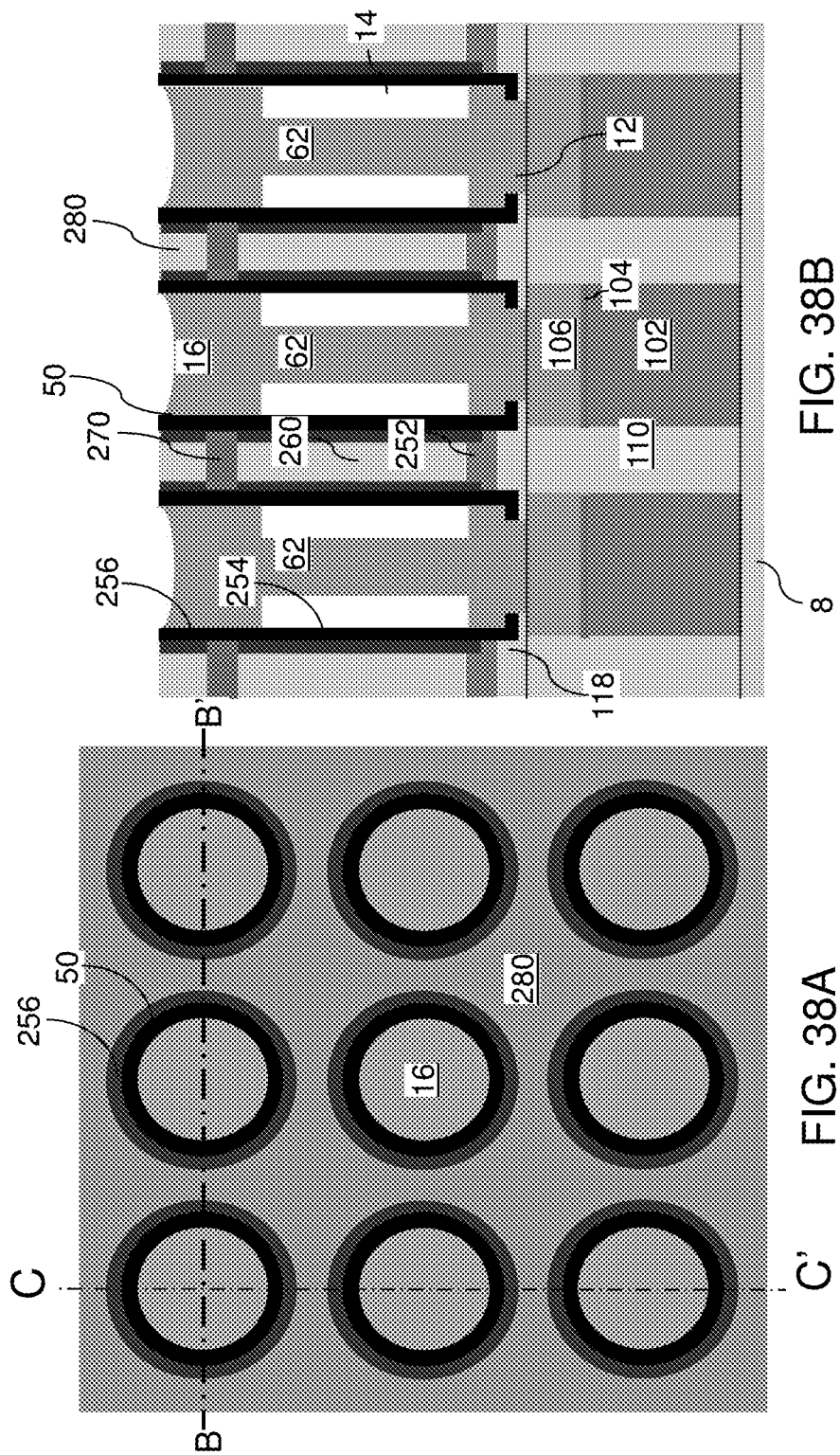

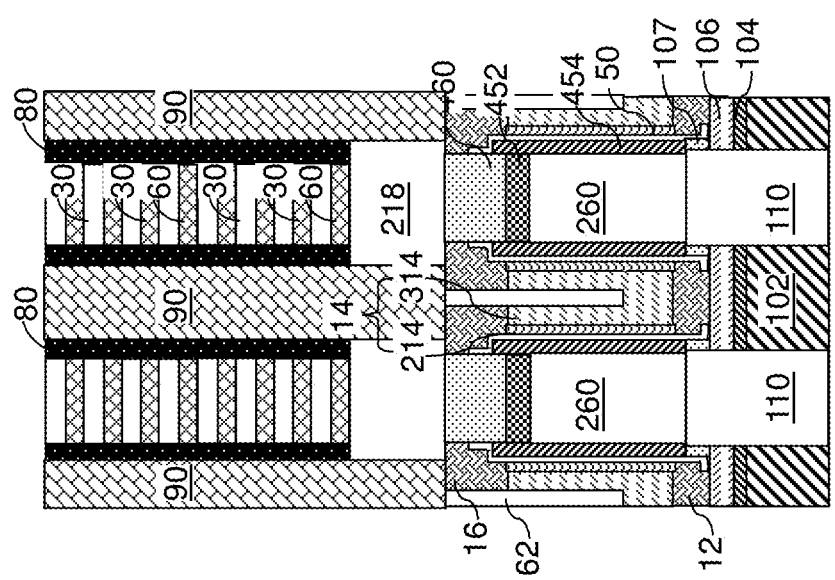

SURROUND GATE VERTICAL FIELD EFFECT TRANSISTORS INCLUDING TUBULAR AND STRIP ELECTRODES AND METHOD OF MAKING THE SAME

FIELD

The present disclosure relates generally to the field of semiconductor devices and specifically to a two-dimensional array of surround gate field effect transistors and methods of manufacturing the same.

BACKGROUND

Resistive Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman A resistive memory cell can be programmed into a set state having a low electrical resistance, or a reset state having a high resistance. A write operation stores data in a set of resistive memory cells by programming each resistive memory cell into a set state or a reset state depending on the contents of the data. For example, "1" can correspond to a set state and "0" can correspond to a reset state, or vice versa.

SUMMARY

According to an aspect of the present disclosure, a semiconductor structure comprising a two-dimensional array of vertical field effect transistors is provided. The two-dimensional array of vertical field effect transistors comprises: a one-dimensional array of gate electrode strips laterally extending along a first horizontal direction and laterally spaced among one another along a second horizontal direction, wherein each of the gate electrode strips comprises openings arranged along the first horizontal direction; a two-dimensional array of tubular gate electrode portions located on the one-dimensional array of gate electrode strips, wherein each of the tubular gate electrode portions includes an opening that overlies, or underlies, a respective opening in the gate electrode strips; gate dielectrics located on an inner sidewall of each of the tubular gate electrode portions; and vertical semiconductor channels laterally surrounded by a respective one of the gate dielectrics and extending along a vertical direction.

According to another aspect of the present disclosure, a method of forming a semiconductor structure is provided, which comprises the steps of: forming a stack including doped semiconductor strips, a one-dimensional array of gate electrode strips, and a dielectric matrix layer over a substrate, wherein the doped semiconductor strips have a first width along a first horizontal direction and laterally extend along a second horizontal direction, and the one-dimensional array of gate electrode strips have a second width along the second horizontal direction and laterally extend along the first horizontal direction; forming a two-dimensional array of openings through the dielectric matrix layer and the one-dimensional array of gate electrode strips; forming a two-dimensional array of tubular gate electrode portions in the two-dimensional array of openings, wherein each of the tubular gate electrode portions is formed directly on a respective one of the gate electrode strips; forming gate dielectrics on inner sidewalls of the tubular gate electrode portions; and forming vertical semiconductor channels within each of the gate dielectrics by deposition of a semiconductor material.

According to another aspect of the present disclosure, a semiconductor structure comprises a plurality of vertical semiconductor channel pillars extending in a vertical direction perpendicular to a top surface of a substrate, bottom and top active regions contacting respective bottom and top ends of the vertical semiconductor pillars, gate dielectrics surrounding respective vertical semiconductor channel pillars, gate electrodes surrounding respective gate dielectrics and vertical semiconductor channel pillars, and gate electrode strips which are thinner than the gate electrodes in the vertical direction, wherein each gate electrode strip contacts one of top or bottom parts of a plurality of the gate electrodes.

BRIEF DESCRIPTION OF THE DRAWINGS

FIG. 1A is a top-down view of a first exemplary structure after formation of a layer stack including a conductive material layer, a metal nitride layer, a doped semiconductor layer, and a sacrificial pad layer according to a first embodiment of the present disclosure.

FIG. 1B is a vertical cross-sectional view of the first exemplary structure along the vertical plane B-B' of FIG. 1A.

FIG. 2A is a top-down view of the first exemplary structure after formation of an alternating sequence of conductive rails and dielectric separator rails that alternate along a second horizontal direction according to the first embodiment of the present disclosure.

FIG. 2B is a vertical cross-sectional view of the first exemplary structure along the vertical plane B-B' of FIG. 2A.

FIG. 11A is a top-down view of the first exemplary structure after formation of a gate dielectric layer and a first vertical channel layer according to the first embodiment of the present disclosure.

FIGS. 11B-11D are vertical cross-sectional views of the first exemplary structure along the vertical planes B-B', C-C', and D-D' of FIG. 10A.

FIG. 14E is a three-dimensional perspective cut-away view of the first exemplary structure of FIG. 14A.

FIG. 18A is a top-down view of the second exemplary structure after application and patterning of a photoresist layer, transfer of the pattern in the photoresist layer through the hard mask layer and the gate electrode strips, and formation of a two-dimensional array of openings through the gate electrode strips according to the second embodiment of the present disclosure.

FIGS. 18B-18D are vertical cross-sectional views of the second exemplary structure along the vertical planes B-B', C-C', and D-D' of FIG. 18A.

FIG. 18E is a top-down view of an alternative configuration of the second exemplary structure at the processing steps of FIGS. 18A-18D.

FIG. 22A is a top-down view of the second exemplary structure after formation of gate dielectrics and first vertical channel portions according to the second embodiment of the present disclosure.

FIGS. 22B-22D are vertical cross-sectional views of the second exemplary structure along the vertical planes B-B', C-C', and D-D' of FIG. 22A.

FIG. 23A is a top-down view of the second exemplary structure after formation of second vertical channel portions, dielectric cores, bottom active regions, and top active regions according to the second embodiment of the present disclosure.

FIGS. 23B-23D are vertical cross-sectional views of the second exemplary structure along the vertical planes B-B', C-C', and D-D' of FIG. 23A.

FIG. 24A is a top-down view of a third exemplary structure after formation of a laterally alternating sequence of dielectric separator rails and stacks of a conductive rail and a doped semiconductor strip according to a third embodiment of the present disclosure.

FIG. 24B is a vertical cross-sectional view of the third exemplary structure along the vertical plane B-B' of FIG. 24A.

FIG. 25A is a top-down view of the third exemplary structure after formation of a planar insulating spacer layer and gate electrode strips according to the third embodiment of the present disclosure.

FIG. 25B is a vertical cross-sectional view of the third exemplary structure along the vertical plane B-B' of FIG. 25A.

FIG. 27A is a top-down view of the third exemplary structure after formation of a two-dimensional array of openings through the dielectric template layer, the dielectric cap layer, and the dielectric matrix layer according to the third embodiment of the present disclosure.

FIG. 27B is a vertical cross-sectional view of the third exemplary structure along the vertical plane B-B' of FIG. 27A.

FIG. 28A is a top-down view of the third exemplary structure after recessing the dielectric template layer and the dielectric matrix layer relative to the dielectric cap layer according to the third embodiment of the present disclosure.

FIG. 28B is a vertical cross-sectional view of the third exemplary structure along the vertical plane B-B' of FIG. 28A.

FIG. 29A is a top-down view of the third exemplary structure after deposition of a conformal conductive material layer according to the third embodiment of the present disclosure.

FIG. 29B is a vertical cross-sectional view of the third exemplary structure along the vertical plane B-B' of FIG. 29A.

FIG. 30A is a top-down view of the third exemplary structure after formation of tubular gate electrode portions and extension of the two-dimensional array of openings through the gate electrode strips according to the third embodiment of the present disclosure.

FIG. 30B is a vertical cross-sectional view of the third exemplary structure along the vertical plane B-B' of FIG. 30A.

FIG. 31A is a top-down view of the third exemplary structure after formation of a gate dielectric layer and a cover material layer according to the third embodiment of the present disclosure.

FIG. 31B is a vertical cross-sectional view of the third exemplary structure along the vertical plane B-B' of FIG. 31A.

FIG. 32A is a top-down view of the third exemplary structure after formation of gate dielectrics, a two-dimensional array of openings through the planar insulating spacer layer, and removal of the cover material layer according to the third embodiment of the present disclosure.

FIG. 32B is a vertical cross-sectional view of the third exemplary structure along the vertical plane B-B' of FIG. 32A.

FIG. 33A is a top-down view of the third exemplary structure after formation of a vertical channel layer and a dielectric material layer according to the third embodiment of the present disclosure.

FIG. 33B is a vertical cross-sectional view of the third exemplary structure along the vertical plane B-B' of FIG. 33A.

FIG. 34A is a top-down view of the third exemplary structure after formation of dielectric cores according to the third embodiment of the present disclosure.

FIG. 34B is a vertical cross-sectional view of the third exemplary structure along the vertical plane B-B' of FIG. 34A.

FIG. 35A is a top-down view of the third exemplary structure after formation of vertical channels by anisotropically etching the vertical channel layer according to the third embodiment of the present disclosure.

FIG. 35B is a vertical cross-sectional view of the third exemplary structure along the vertical plane B-B' of FIG. 35A.

FIG. 36A is a top-down view of the third exemplary structure after formation of a doped semiconductor material layer according to the third embodiment of the present disclosure.

FIG. 36B is a vertical cross-sectional view of the third exemplary structure along the vertical plane B-B' of FIG. 36A.

FIG. 37A is a top-down view of the third exemplary structure after an anneal process according to the third embodiment of the present disclosure.

FIG. 37B is a vertical cross-sectional view of the third exemplary structure along the vertical plane B-B' of FIG. 37A.

FIG. 38A is a top-down view of the third exemplary structure after formation of top active regions according to the third embodiment of the present disclosure.

FIGS. 38B and 38C are vertical cross-sectional views of the third exemplary structure along the vertical planes B-B' and C-C' of FIG. 38A, respectively.

FIGS. 39A, 39B, and 39C are additional exemplary structures including a three-dimensional memory array and one of the first, second, and third exemplary structures according to an embodiment of the present disclosure.

DETAILED DESCRIPTION

Figure 3A:
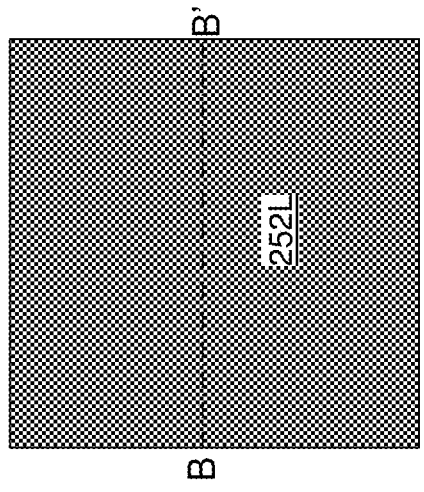
FIG. 3A is a top-down view of the first exemplary structure after recessing the dielectric spacer rails and removing remaining portions of the sacrificial pad layer according to the first embodiment of the present disclosure.

Resistive memory cells of a ReRAM memory device can be arranged in a three-dimensional array that is accessed by a two-dimensional array of vertical bit lines. A two-dimensional array of vertical select field effect transistors can be connected to the two-dimensional array of vertical bit lines to access the resistive memory cells. The present inventors realized that conventional vertical select field effect transistors may contain suboptimum on current and leakage current. Such vertical field effect transistors typically have a dual channel configuration, in which each vertical channel is controlled by a pair of gate electrodes. Typically, each vertical channel has a rectangular horizontal cross-sectional shape, and the pair of gate electrodes controls electron flow along two sidewalls of a rectangular pillar that constitutes the vertical channel Current flow along the other two sidewalls of the rectangular pillar is only indirectly controlled by the pair of gate electrodes in this configuration. Thus, leakage current and degradation of turn-on characteristics are common in such configurations. In one embodiment of the present disclosure, the vertical select field effect transistor contains a ladder shaped surround select gate electrode which surrounds the entire channel. This configuration can improve the on current of the transistor As discussed above, the present disclosure is directed to a two-dimensional array of surround gate field effect transistors and methods of manufacturing the same, the various aspects of which are described below. The embodiments of the disclosure can be employed to form various semiconductor devices, such as three-dimensional monolithic memory array devices comprising ReRAM devices, that include a two-dimensional array of vertical field effect select transistors. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

Referring to FIGS. 1A and 1B, a first exemplary structure is illustrated, which includes a layer stack (102L, 104L, 106L, 107L) that can be formed on a top surface of a substrate (not shown) including an insulating top surface. The layer stack (102L, 104L, 106L, 107L) includes a conductive material layer 102L, an optional metal nitride layer 104L, a doped semiconductor layer 106L, and a sacrificial pad layer 107L. The doped semiconductor material layer 106L can be formed over, and can be electrically shorted to, the conductive material layer 102L. In an illustrative example, the conductive material layer 102L can include tungsten or copper; the optional metal nitride layer 104L can include titanium nitride, tantalum nitride layer, or tungsten nitride layer; the doped semiconductor layer 106L can include doped polysilicon or doped amorphous silicon (that can be subsequently converted into doped polysilicon through an anneal) having a doping of a first conductivity type (which can be p-type or n-type); and the sacrificial pad layer 107L can include silicon nitride or silicon oxynitride. The thickness of the conductive material layer 102L can be in a range from 50 nm to 300 nm, the thickness of the optional metal nitride layer 104L can be in a range from 3 nm to 30 nm, the thickness of the doped semiconductor layer 106L can be in a range from 10 nm to 40 nm, and the thickness of the sacrificial pad layer 107L can be in a range from 4 nm to 40 nm, although lesser and greater thicknesses can be employed for each layer.

Referring to FIGS. 2A and 2B, line trenches are formed through the layer stack (102L, 104L, 106L, 107L), for example, by applying and patterning a photoresist layer (not shown) over the layer stack (102L, 104L, 106L, 107L) and transferring the pattern in the photoresist layer through the layer stack (102L, 104L, 106L, 107L) by at least one anisotropic etch process. The line trenches are laterally spaced among one another along a first horizontal direction hd1, and laterally extend along a second horizontal direction hd2 (i.e., global bit line direction) that is perpendicular to the first horizontal direction hd1. As used herein, a "line trench" refers to an elongated trench having a uniform width along a direction perpendicular to the lengthwise direction thereof. A top surface of an underlying substrate can be physically exposed at the bottom of each line trench. At least one dielectric material (such as a combination of a silicon nitride liner and a silicon oxide fill material) can be deposited in the line trenches, and excess portions of the at least one dielectric material can be removed from the horizontal plane including the top surface of the sacrificial pad layer 107L by a planarization process (such as a chemical mechanical planarization process or a recess etch process).

Remaining portions of the at least one dielectric material constitute dielectric separator rails 110. As used herein, a "rail" refers to a structure that laterally extends in a lengthwise direction. In one non-limiting embodiment, a rail can extend with a uniform vertical cross-sectional shape along the vertical planes that are perpendicular to the lengthwise direction of the structure. Each remaining portion of the conductive material layer 102L constitutes a conductive rail 102 that laterally extends along the second horizontal direction hd2. An alternating sequence of conductive rails 102 and dielectric separator rails 110 that alternate along the second horizontal direction hd2 is formed. Each remaining portion of the metal nitride layer 104L constitutes a metal nitride strip 104 that laterally extends along the second horizontal direction hd2 and has a uniform width along the first horizontal direction hd1. Each combination of a conductive rail 102 and optional overlying metal nitride strip 104 can correspond to a global bit line of a ReRAM device. The alternating sequence of conductive rails 102 and dielectric separator rails 110 can have a pitch in a range from 50 nm to 400 nm along the first horizontal direction hd1, although lesser and greater pitches can also be employed. The width of the conductive rails 102 can be in a range from 20% to 80% of the pitch. The width of the dielectric separator rails 110 can be in a range from 20% to 80% of the pitch.

Each remaining portion of the doped semiconductor layer 106L constitutes a doped semiconductor strip 106, which is a doped semiconductor layer having a finite width. Specifically, each doped semiconductor strip 106 laterally extends along the second horizontal direction hd2 and has the uniform width along the first horizontal direction hd1. The doped semiconductor strips 106 can have a first width along the first horizontal direction hd1 and can laterally extend along the second horizontal direction hd2. Each doped semiconductor strip 106 may comprise a global source or drain region of a ReRAM device. Each remaining portion of the sacrificial pad layer 107L constitutes a sacrificial pad strip 107 that laterally extends along the second horizontal direction hd2 and has the uniform width along the first horizontal direction hd1.

Figure 3B:
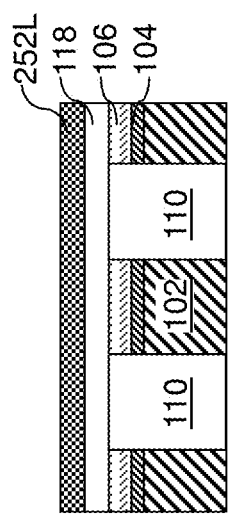
FIG. 3B is a vertical cross-sectional view of the first exemplary structure along the vertical plane B-B' of FIG. 3A.

Referring to FIGS. 3A and 3B, the dielectric separator rails 110 can be optionally vertically recessed, for example, by a recess etch approximately to the height of the top surfaces of the doped semiconductor strips 106. If the dielectric spacer rails 110 include silicon oxide, a wet etch employing dilute hydrofluoric acid may be employed. Concurrently or subsequently, the sacrificial pad strips 107 can be removed by an isotropic etch process such as a wet etch process. In an illustrative example, if the sacrificial pad strips 107 include silicon nitride, a wet etch employing hot phosphoric acid can be employed to remove the sacrificial pad strips 107.

Figure 4A:
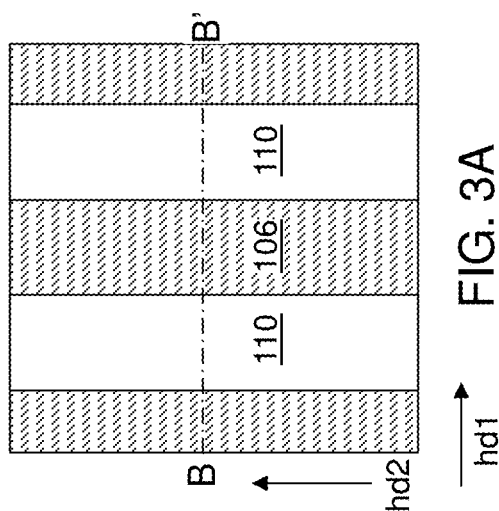
FIG. 4A is a top-down view of the first exemplary structure after formation of a planar insulating spacer layer and a planar gate electrode layer according to the first embodiment of the present disclosure.
Figure 4B:
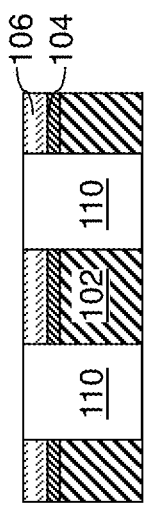
FIG. 4B is a vertical cross-sectional view of the first exemplary structure along the vertical plane B-B' of FIG. 4A.

Referring to FIGS. 4A and 4B, a planar insulating spacer layer 118 and a planar gate electrode layer 252L can be sequentially formed. The planar insulating spacer layer 118 includes an insulating material such as silicon oxide. The planar insulating spacer layer 118 can have a uniform thickness, which can be in a range from 10 nm to 50 nm, such as from 15 nm to 30 nm. The planar gate electrode layer 252L includes a conductive material that is subsequently patterned into gate electrode strips. The planar gate electrode layer 252L can include a doped semiconductor material (such as doped polysilicon or an amorphous doped polysilicon that can be subsequently annealed into doped polysilicon) or a metallic material (such as a conductive metal nitride, an elemental metal, or an intermetallic alloy). For example, the planar gate electrode layer 252L can include a metal, such as tungsten and/or a conductive metal nitride material, such as TiN, TaN, or WN. The thickness of the planar gate electrode layer 252L can be in a range from 10 nm to 100 nm, such as from 20 nm to 50 nm, although lesser and greater thicknesses can also be employed.

Referring to FIGS. 5A-5D, the planar gate electrode layer 252L can be patterned, for example, by application and patterning of a photoresist layer (not shown) thereabove, and by transfer of the pattern in the photoresist layer though the planar gate electrode layer 252L by an etch process. The etch process can be an anisotropic etch process or an isotropic etch process. The patterned portions of the planar gate electrode layer 252L form gate electrode strips 252. Each of the gate electrode strips 252 can laterally extend along the first horizontal direction hd1, and can be laterally spaced among one another along the second horizontal direction. In one embodiment, the gate electrode strips 252 can have a uniform width along the second horizontal direction hd2, and a uniform spacing along the second horizontal direction hd2. In one embodiment, the gate electrode strips 252 can form a one-dimensional periodic array of gate electrode strips 252. The one-dimensional array of gate electrode strips 252 can have a second width along the second horizontal direction hd2 and laterally extend along the first horizontal direction hd1.

Referring to FIGS. 6A-6D, a dielectric matrix layer 260 can be formed over the one-dimensional array of gate electrode strips 252. The dielectric material of the dielectric matrix layer 260 can include, for example, silicon oxide (e.g., densified silicon oxide formed from a TEOS source), organosilicate glass, and/or a doped silicate glass. The dielectric matrix layer 260 can be formed by conformal or non-conformal deposition of the dielectric material. The thickness of the dielectric matrix layer 260, as measured from above the top surfaces of the gate electrode strips 252, can be in a range from 50 nm to 500 nm, such as from 200 nm to 300 nm, although lesser and greater thicknesses can also be employed. The top surface of the dielectric matrix layer 260 can be horizontal.

Figure 7A:
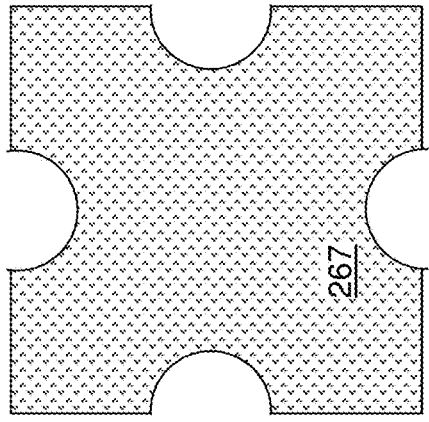
FIG. 7A is a top-down view of the first exemplary structure after application and patterning of a photoresist layer according to the first embodiment of the present disclosure.
Figure 7C:
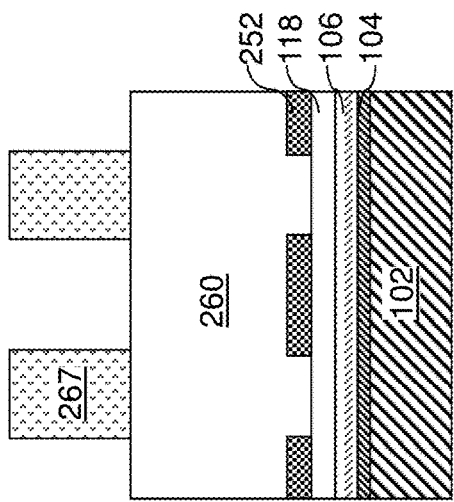
FIGS. 7B-7D are vertical cross-sectional views of the first exemplary structure along the vertical planes B-B', C-C', and D-D' of FIG. 7A.
Figure 7B:
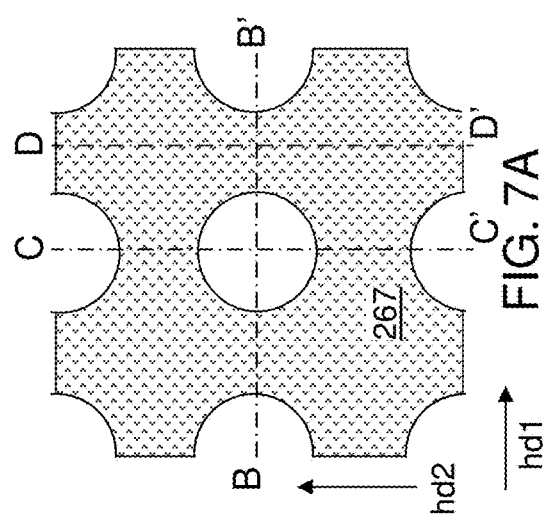
Figure 7E:
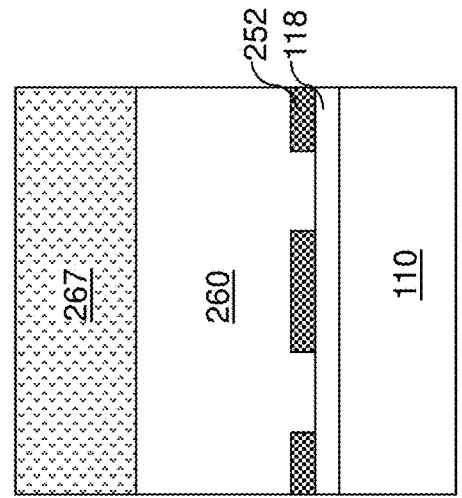
FIG. 7E is a top-down view of an alternative configuration of the first exemplary structure at the processing steps of FIGS. 7A-7D.
Figure 7D:
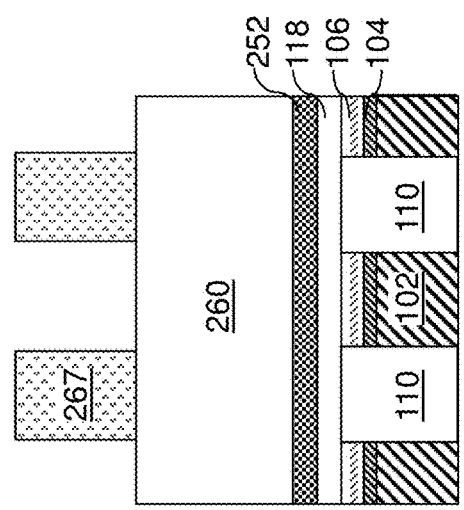
Figure 8C:
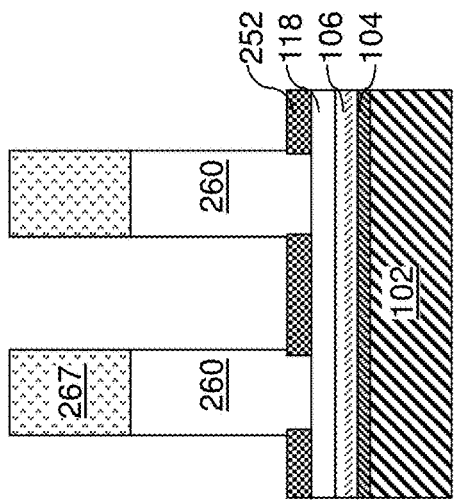
FIGS. 8B-8D are vertical cross-sectional views of the first exemplary structure along the vertical planes B-B', C-C', and D-D' of FIG. 8A.
Figure 8D:
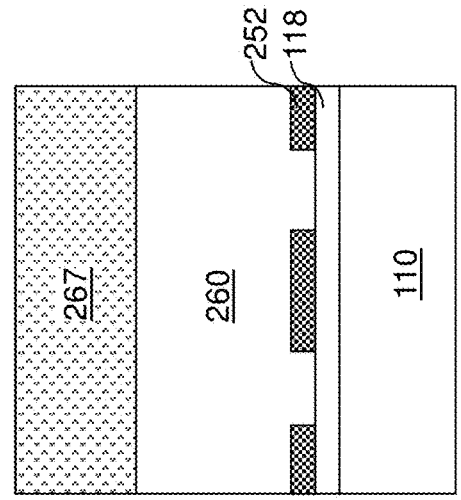
Figure 8A:
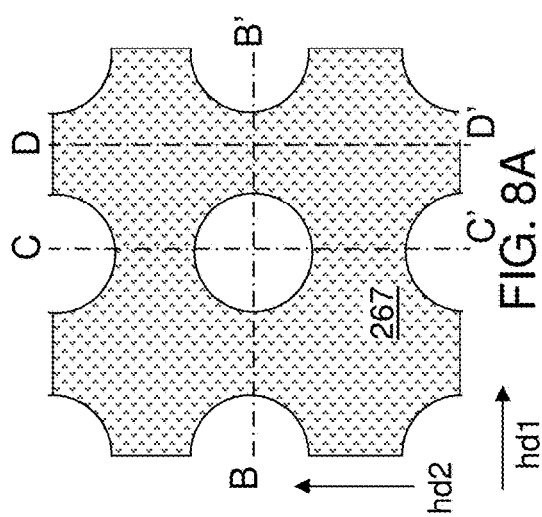
FIG. 8A is a top-down view of the first exemplary structure after formation of a two-dimensional array of openings through the dielectric matrix layer according to the first embodiment of the present disclosure.
Figure 8B:
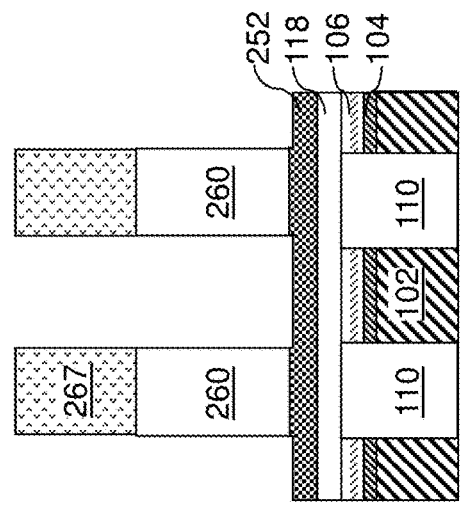
Figure 9A:
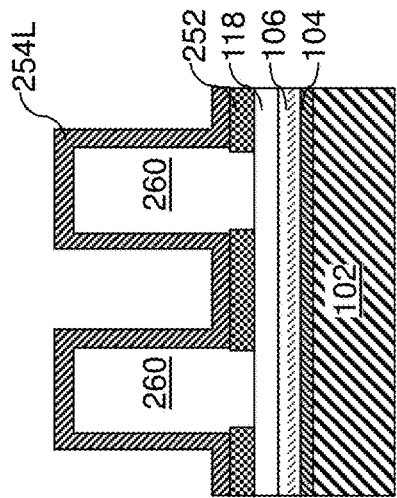
FIG. 9A is a top-down view of the first exemplary structure after deposition of a conformal conductive material layer according to the first embodiment of the present disclosure.
Figure 9D:
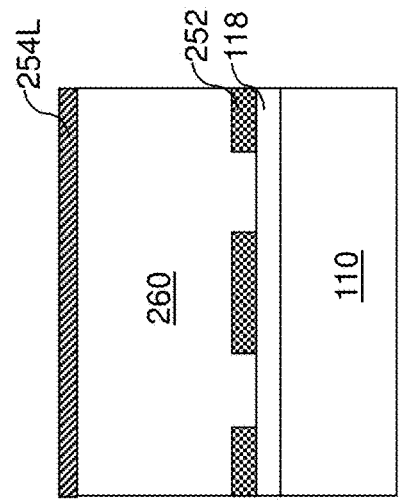
FIGS. 9B-9D are vertical cross-sectional views of the first exemplary structure along the vertical planes B-B', C-C', and D-D' of FIG. 9A.
Figure 9B:
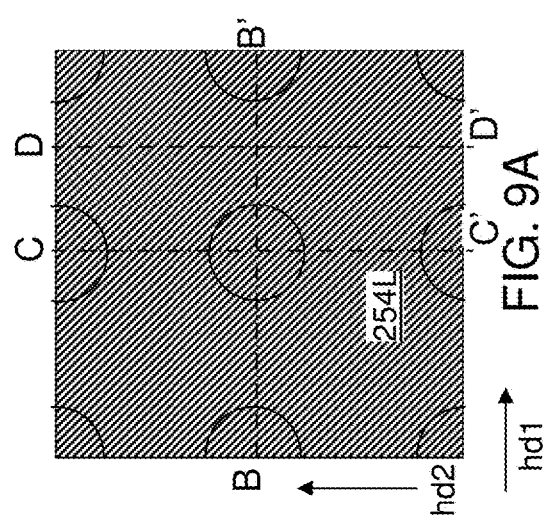
Figure 9C:
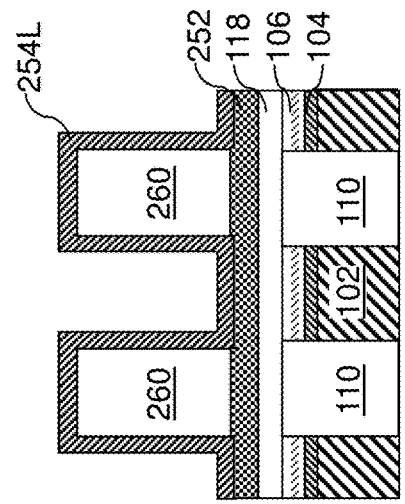
Figure 10C:
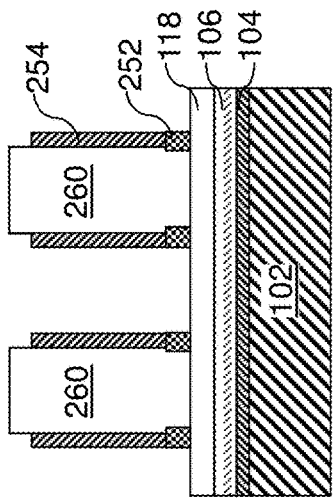
FIGS. 10B-10D are vertical cross-sectional views of the first exemplary structure along the vertical planes B-B', C-C', and D-D' of FIG. 10A.
Figure 10D:
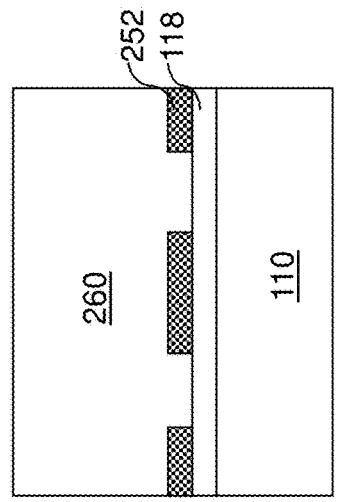
Figure 10A:
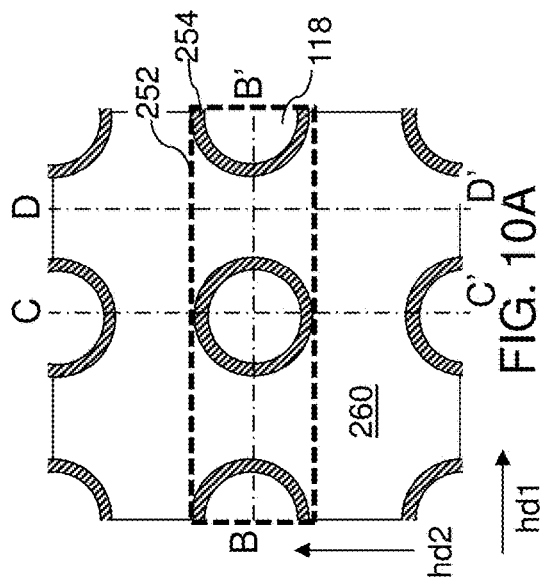
FIG. 10A is a top-down view of the first exemplary structure after formation of tubular gate electrode portions and extension of the two-dimensional array of openings through the gate electrode strips according to the first embodiment of the present disclosure.
Figure 10B:
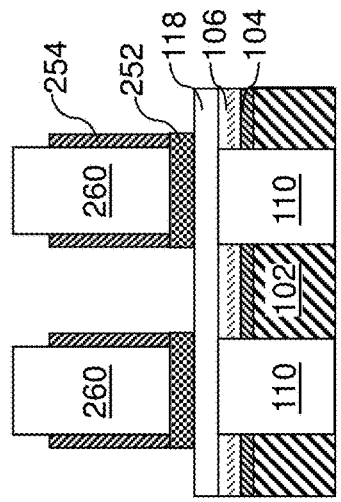
Figure 12A:
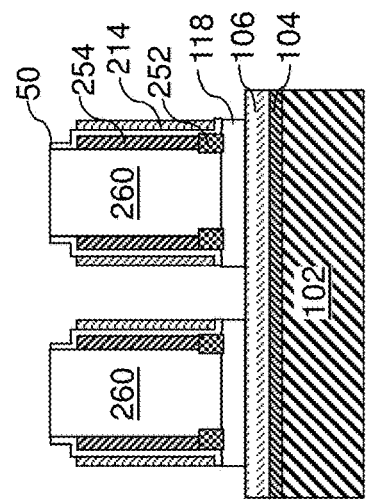
FIG. 12A is a top-down view of the first exemplary structure after anisotropically etching the gate dielectrics and the first vertical channel layer and forming openings through the planar insulating spacer layer according to the first embodiment of the present disclosure.
Figure 12C:
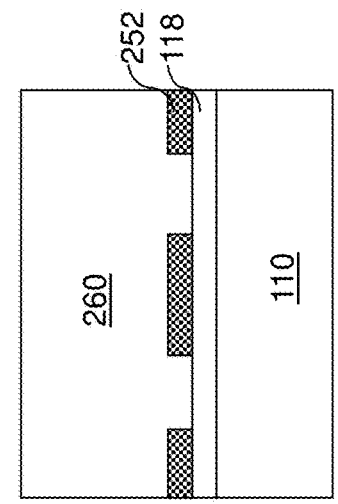
FIGS. 12B-12D are vertical cross-sectional views of the first exemplary structure along the vertical planes B-B', C-C', and D-D' of FIG. 12A.
Figure 12B:
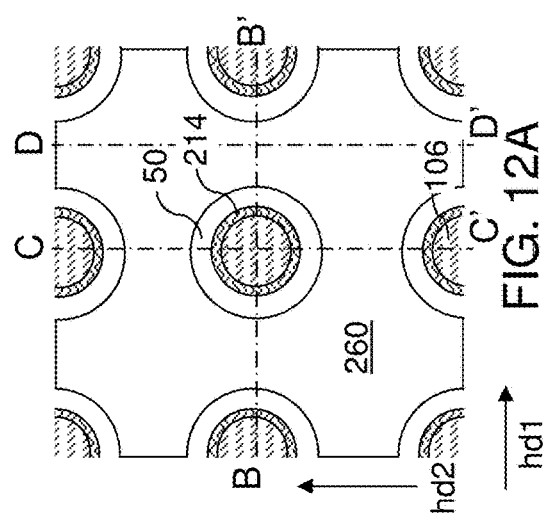
Figure 12D:
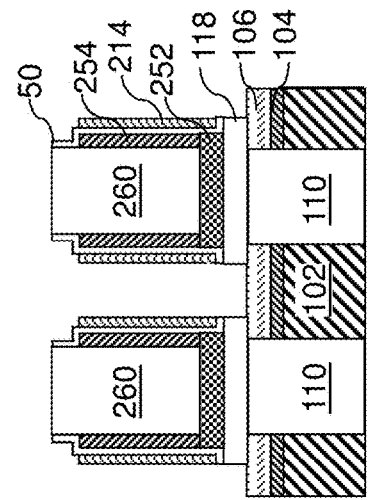
Figure 13C:
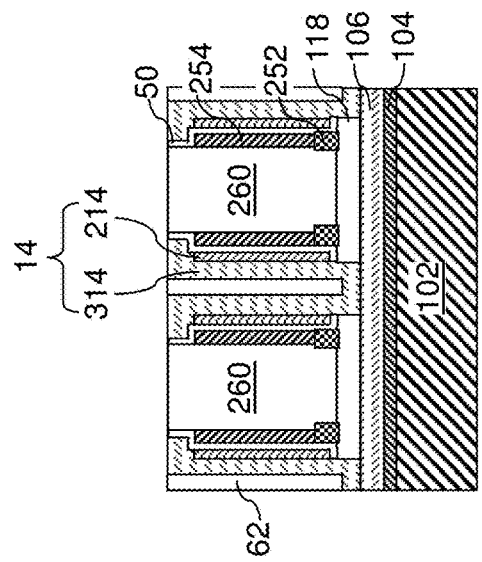
FIGS. 13B-13D are vertical cross-sectional views of the first exemplary structure along the vertical planes B-B', C-C', and D-D' of FIG. 13A.
Figure 13D:
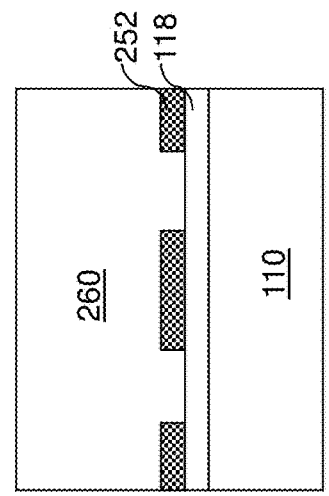
Figure 13A:
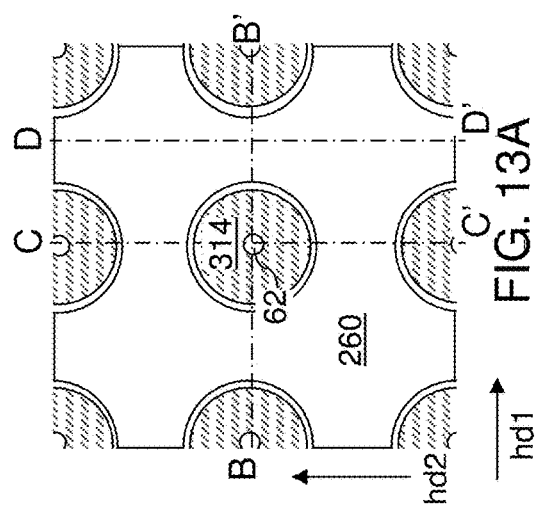
FIG. 13A is a top-down view of the first exemplary structure after formation of second vertical channel portions and dielectric cores according to the first embodiment of the present disclosure.
Figure 13B:
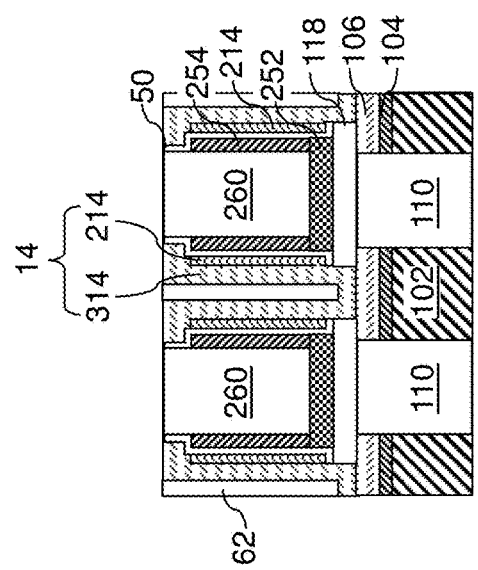
Figure 14D:
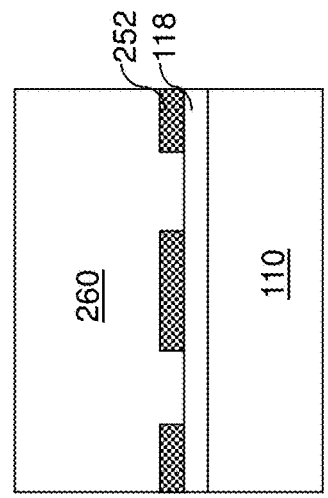
FIGS. 14B-14D are vertical cross-sectional views of the first exemplary structure along the vertical planes B-B', C-C', and D-D' of FIG. 14A.
Figure 14C:
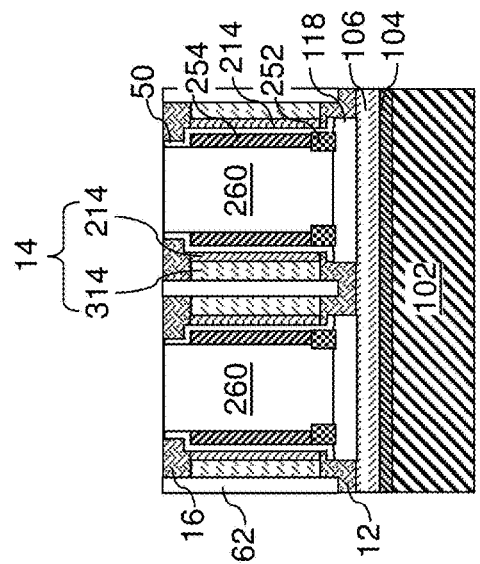
Figure 14A:
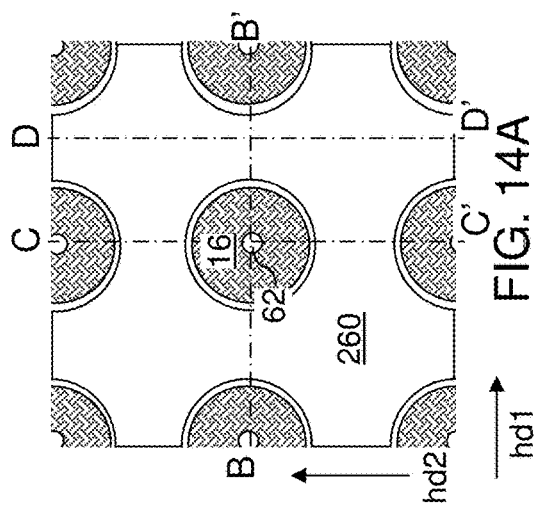
FIG. 14A is a top-down view of the first exemplary structure after formation of bottom active regions and top active regions according to the first embodiment of the present disclosure.
Figure 14B:
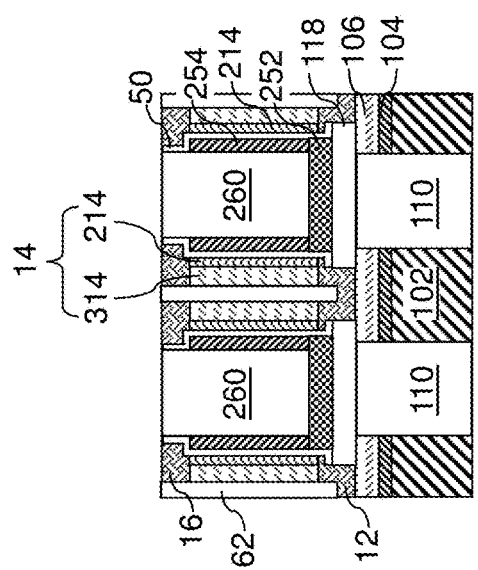

Referring to FIGS. 7A-7D, a photoresist layer 267 can be applied over the top surface of the dielectric matrix layer 260, and can be lithographically patterned to form a two-dimensional array of openings therethrough. In one embodiment, the two-dimensional array of openings can be periodic two-dimensional array having a first periodicity along the first horizontal direction hd1 and having a second periodicity along the second horizontal direction hd2. In one embodiment, the two-dimensional array of openings can be rectangular array or a hexagonal array. Each opening in the patterned photoresist layer 267 can have a substantially same horizontal cross-sectional shape, which can be the shape of a circle, an ellipse, an oval, a rectangle, a hexagon, or any other polygon or a curvilinear shape of a two-dimensional closed shape. In one embodiment, the openings in the patterned photoresist layer 267 can have a shape of a circle or an ellipse. The openings in the photoresist layer 267 can be arranged in various patterns. The pattern of the openings illustrated in FIGS. 7A-7D is a pattern of a periodic rectangular array. FIG. 7E illustrates an exemplary alternative staggered pattern for the openings in the photoresist layer 267, in which the openings in neighboring rows are staggered by half the pitch of a one-dimensional array of openings within each row. The areas of the openings in the photoresist layer 267 can overlap with the areas of the gate electrode strips 252. Further, the areas of the openings in the photoresist layer 267 can overlap with the areas of the conductive rails 102.

Referring to FIGS. 8A-8D, an anisotropic etch process is performed to transfer the pattern of the photoresist layer 267 through the dielectric matrix layer 260. A two-dimensional array of openings having vertical sidewalls is formed through the dielectric matrix layer 260. A top surface of a gate electrode strip 252 can be physically exposed at the bottom of each opening in the dielectric matrix layer 260. The shape of each opening can be cylindrical with a horizontal cross-sectional shape that is the same as the horizontal cross-sectional shape of an overlying opening in the photoresist layer 267. In one embodiment, physically exposed horizontal surfaces of the gate electrode strips 252 can be vertically recessed below a horizontal plane including the interface between the unrecessed top surfaces of the gate electrode strips 252 and the dielectric matrix layer 260. The photoresist layer 267 can be subsequently removed, for example, by ashing.

Referring to FIGS. 9A-9D, a conformal conductive material layer 254L is subsequently deposited on the physically exposed surfaces of the dielectric matrix layer 260 and the gate electrode strips 252. The conformal conductive material layer 254L includes a conductive material such as a metallic material or a heavily doped semiconductor material. For example, the conformal conductive material layer 254L can include an elemental metal (e.g., tungsten), an intermetallic alloy, and/or a conductive metal nitride such as TiN, TaN, or WN. The conformal conductive material layer 254L can be deposited by a conformal deposition process such as chemical vapor deposition (CVD) or atomic layer deposition (ALD). The thickness of the conformal conductive material layer 254L can be in a range from 5 nm to 100 nm, such as from 10 nm to 50 nm, although lesser and greater thicknesses can also be employed.

Referring to FIGS. 10A-10D, an anisotropic etch process is performed to remove horizontal portions of the conformal conductive material layer 254L from above the top surface of the dielectric matrix layer 260 and at the bottom of each opening in the dielectric matrix layer 260. Remaining vertical portions of the conformal conductive material layer 254L constitute tubular gate electrode portions 254 (e.g., surround gate electrodes). Each tubular gate electrode portion 254 has a tubular configuration such that an opening vertically extends through the tubular gate electrode portion 254. The inner sidewalls and the outer sidewalls of the tubular gate electrode portions 254 can be vertical. Each annular bottom surface of the tubular gate electrode portions 254 can contact a top surface of a respective one of the gate electrode strips 252 (shown by dashed lines in FIG. 10A because the strips are below the plane of view of FIG. 10A).

Each gate electrode strip 252 contacts a row of tubular gate electrode portions 254 arranged along the first horizontal direction hd1. In one embodiment, the tubular gate electrode portions 254 can be formed as a two-dimensional array of tubular gate electrode portions 254 in which each of the tubular gate electrode portions 254 is formed directly on a respective one of the gate electrode strips 252. Thus, a two-dimensional array of openings through the dielectric matrix layer 260 and the one-dimensional array of gate electrode strips 252 can be formed by a first anisotropic etch process that forms openings through the dielectric matrix layer 260 and a second anisotropic etch process that forms openings through the one-dimensional array of gate electrode strips 252.

Referring to FIGS. 11A-11D, a gate dielectric layer 50L and an optional first vertical channel layer 214L can be sequentially formed. The gate dielectric layer 50L can be formed by conformal deposition of at least one dielectric material, which can include silicon oxide and/or a dielectric metal oxide. The first vertical channel layer 214L includes an intrinsic semiconductor material or a semiconductor material having a doping of a second conductivity type, which is the opposite of the first conductivity type. For example, if the first conductivity type is n-type, the second conductivity type can be p-type, and vice versa. For example, the first vertical channel layer 214L can include doped amorphous silicon or doped polysilicon, and can have a thickness in a range from 3 nm to 100 nm, such as from 6 nm to 50 nm, although lesser and greater thicknesses can also be employed.

Referring to FIGS. 12A-12D, an anisotropic etch process can be performed to remove horizontal portions of the first vertical channel layer 214L and the gate dielectric layer 50L. Remaining portions of the gate dielectric layer 50L constitute gate dielectrics 50. The gate dielectrics 50 are formed on inner sidewalls of the tubular gate electrode portions 254. The gate dielectrics 50 can have L-shaped vertical cross-sectional shapes. Each gate dielectric 50 can have a cylindrical portion having an inner vertical sidewall and an outer vertical sidewall, and a horizontal "foot" portion including an opening of a lesser maximum lateral dimension than the maximum lateral dimension (such as the diameter, a major axis, or a diagonal) of the opening of the overlying cylindrical portion. Each remaining portion of the first vertical channel layer 214L constitutes a first vertical channel portion 214. Each first vertical channel portion 214 includes an inner vertical sidewall and an outer vertical sidewall. The anisotropic etch can continue to etch physically exposed portions of the planar insulating spacer layer 118 underneath the areas of openings through the first vertical channel portions 214. Openings are formed through the planar insulating spacer layer 118 by the anisotropic etch process. Portions of the top surfaces of the doped semiconductor strips 106 are physically exposed underneath the openings through the planar insulating spacer layer 118.

Referring to FIGS. 13A-13D, a second vertical channel layer including an intrinsic or doped semiconductor material having a doping of the second conductivity type can be deposited in the openings through the dielectric matrix layer 260, the one-dimensional array of gate electrode strips 252, and the planar insulating spacer layer 118 by a conformal deposition. In case the volumes of the openings are not completely filled with the second vertical channel layer, a dielectric core material layer including a dielectric material such as silicon oxide may be deposited in remaining volumes of the openings.

In an alternative embodiment (shown in FIGS. 31A to 33B and described in more detail below), the first vertical channel portion 214 is omitted, and the horizontal portions of the gate dielectric layer 50L are removed to form the gate dielectrics 50 and to expose the underlying doped semiconductor strips 106. The semiconductor channel portion 314 is then formed over the gate dielectrics 50 in contact with the doped semiconductor strips 106.

Materials of the dielectric core material layer (if present) and the second vertical channel layer can be removed from above a horizontal plane including the top surface of the dielectric matrix layer 260 by a planarization process, which can include chemical mechanical planarization and/or a recess etch process. Upper portions of the dielectric matrix layer 260 may be collaterally removed during the planarization process. Each remaining portion of the second vertical channel layer after the planarization process constitutes a second vertical channel portion 314. Each remaining portion of the dielectric core material layer after the planarization process constitutes a dielectric core 62. Each neighboring pair of a first vertical channel portion 214 and a second vertical channel portion 314 constitutes a vertical semiconductor channel 14, which is the channel of a respective vertical field effect transistor. The vertical semiconductor channels 14 are formed in contact with the doped semiconductor strips 106 within each of the gate dielectrics 50 by deposition of at least one semiconductor material having a doping of the second conductivity type.

Referring to FIGS. 14A-14D, dopants of the first conductivity type can be implanted into upper portions of vertical semiconductor channels 14 to form top active regions 16. Alternatively, the vertical semiconductor channels 14 can be vertically recessed, and a doped semiconductor material having a doping of the first conductivity type can be deposited in the recessed regions to form the top active regions 16. Optionally, the dielectric cores 62 may be vertically recessed prior to depositing the doped semiconductor material having a doping of the first conductivity type, in which case the top active regions 16 are formed on recessed top surfaces of the dielectric cores 62. Thus, the active regions 16 can be formed within, or over, upper portions of the vertical semiconductor channels 14.

An anneal process can be performed to outdiffuse the dopants of the first conductivity type from the doped semiconductor strips 106 into bottom portions of the vertical semiconductor channels 14. The bottom portions of the vertical semiconductor channels 14 can be converted into semiconductor portions having a doping of the first conductivity type, which constitute bottom active regions 12. Thus, the bottom active regions 12 can be formed diffusing electrical dopants of the first conductivity type from the doped semiconductor strips 106 into lower portions of the vertical semiconductor channels 14.

The top active regions 16 and the bottom active regions 12 constitute source regions and drain regions of the vertical field effect transistors. Depending on the mode of operation, the top active regions 16 can function as source regions and the bottom active regions 12 can function as drain regions, or vice versa. FIG. 14E illustrates a three-dimensional perspective cut-away view of the device of FIG. 14A.

Figure 15A:
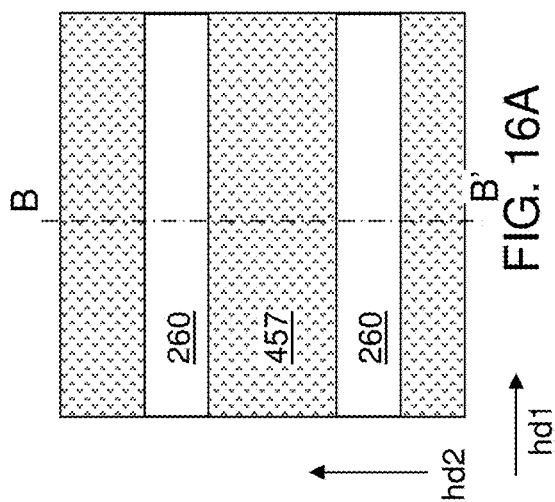
FIG. 15A is a top-down view of a second exemplary structure after formation of a layer stack including a conductive material layer, a metal nitride layer, a doped semiconductor layer, and a planar insulating spacer layer, a dielectric matrix layer, and a planar gate electrode layer according to a second embodiment of the present disclosure.
Figure 15B:
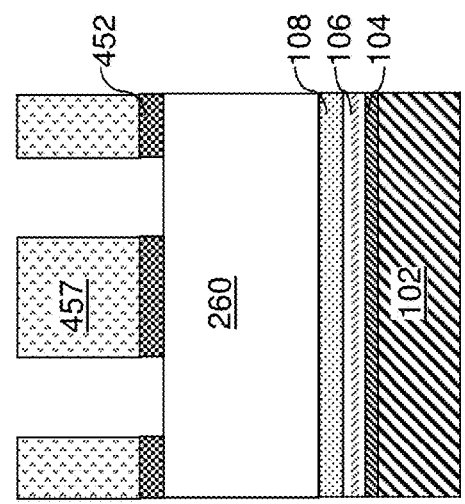
FIG. 15B is a vertical cross-sectional view of the second exemplary structure along the vertical plane B-B' of FIG. 15A.

In a second embodiment of the present disclosure illustrated in FIGS. 15A to 23E, the gate electrode strips (e.g., select gate lines) can be formed at the top rather than at the bottom of the tubular gate electrode portions (e.g., the surround gates). Referring to FIGS. 15A and 15B, a second exemplary structure according to a second embodiment of the present disclosure can be derived from the first exemplary structure of FIGS. 1A and 1B by forming a planar insulating spacer layer 108 in lieu of a sacrificial pad layer 107L, by performing the processing steps of FIGS. 2A and 2B, and by forming a dielectric matrix layer 260 and a planar gate electrode layer 452L. The planar insulating spacer layer 108 can include the same material as, and can have the same thickness as, the planar insulating spacer layer 118 of the first embodiment. The planar insulating spacer layer can be patterned into planar insulating spacer strips 118 during formation of the dielectric separator rails 110. The dielectric material layer 260 can have the same composition and the same thickness as in the first embodiment. The planar gate electrode layer 452L can have the same composition and the same thickness as the planar gate electrode layer 252L of the first embodiment. The planar gate electrode layer 452L can be formed directly on a horizontal top surface of the dielectric matrix layer 260.

Figure 16A:
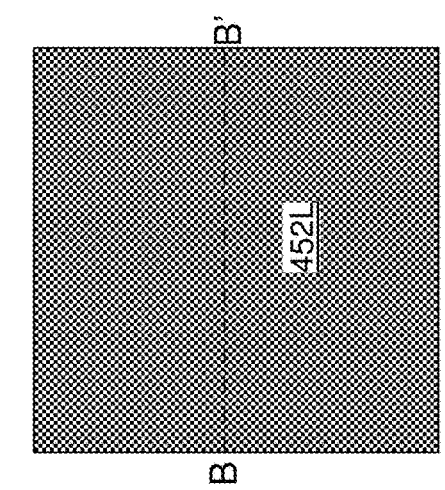
FIG. 16A is a top-down view of the second exemplary structure after patterning the planar gate electrode layer into gate electrode strips according to the second embodiment of the present disclosure.
Figure 16B:
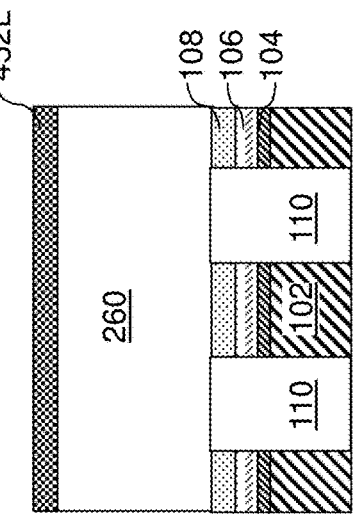
FIG. 16B is a vertical cross-sectional view of the second exemplary structure along the vertical plane B-B' of FIG. 16A.
Figure 17C:
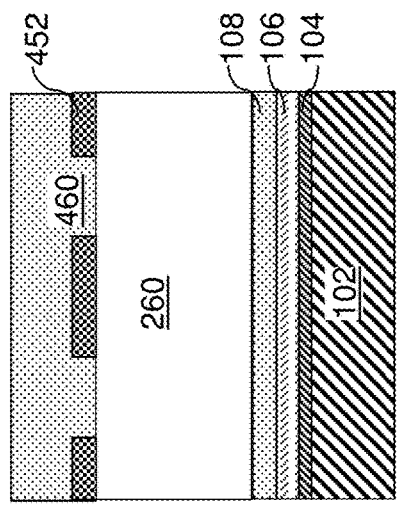
FIGS. 17B-17D are vertical cross-sectional views of the second exemplary structure along the vertical planes B-B', C-C', and D-D' of FIG. 17A.
Figure 17D:
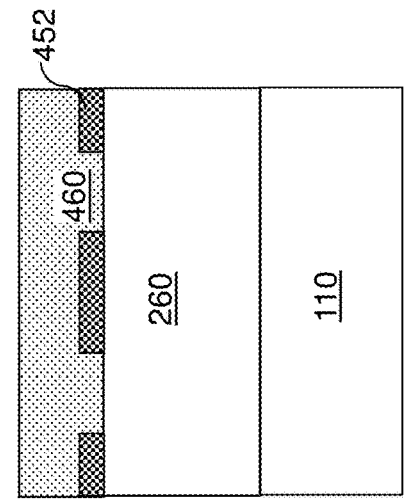
Figure 17A:
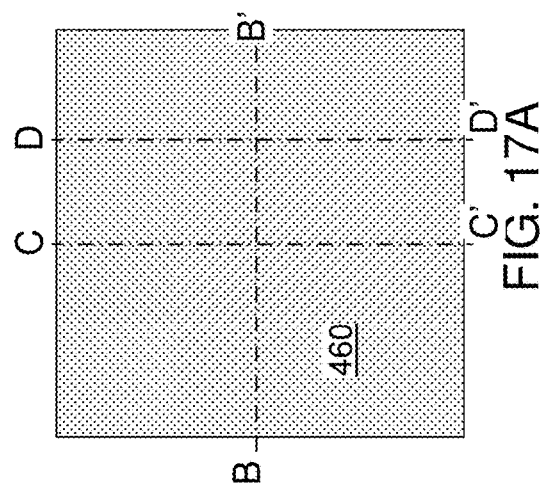
FIG. 17A is a top-down view of the second exemplary structure after formation of a hard mask layer according to the second embodiment of the present disclosure.
Figure 17B:
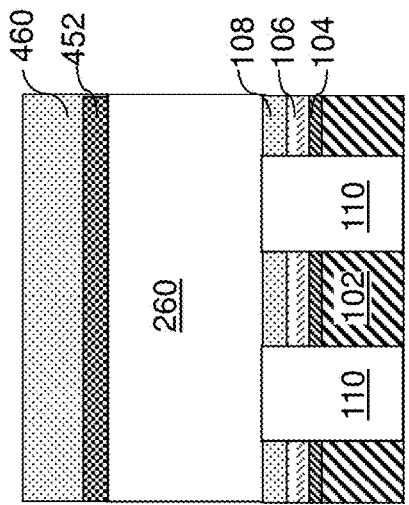
Figure 19A:
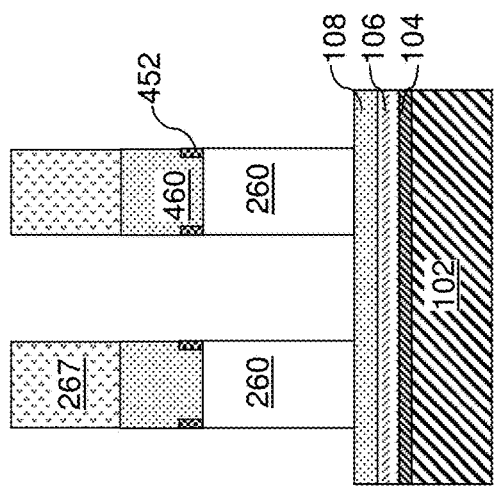
FIG. 19A is a top-down view of the second exemplary structure after formation of a two-dimensional array of openings through the dielectric matrix layer by an anisotropic etch process according to the second embodiment of the present disclosure.
Figure 19B:
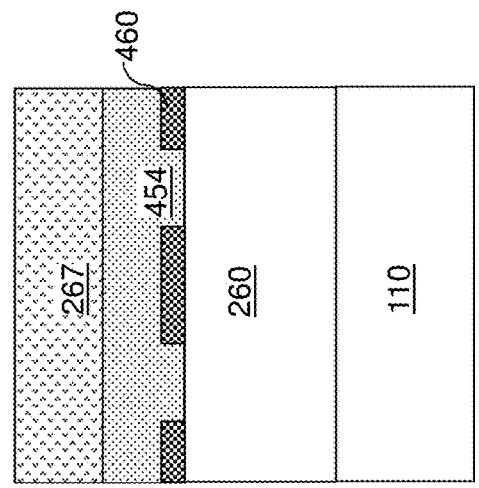
FIGS. 19B-19D are vertical cross-sectional views of the second exemplary structure along the vertical planes B-B', C-C', and D-D' of FIG. 19A.
Figure 19C:
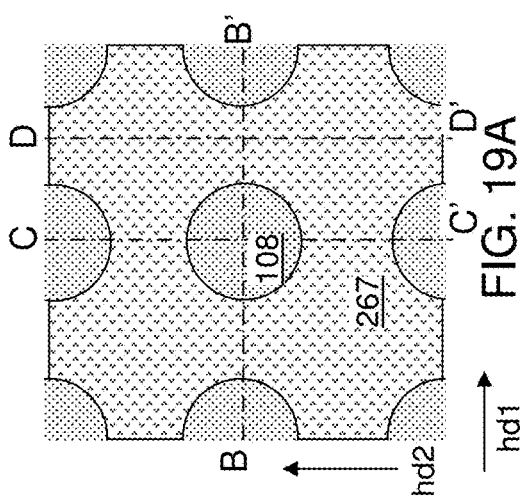
Figure 19D:
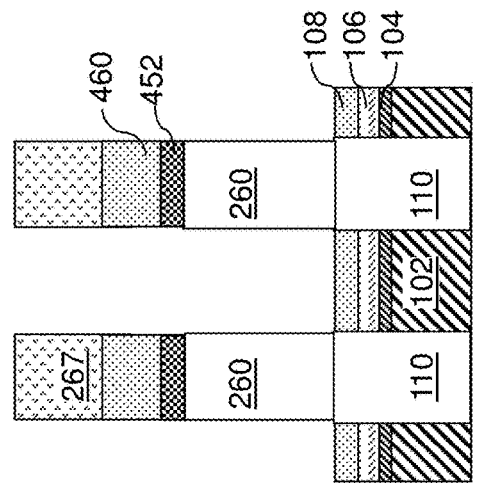
Figure 20C:
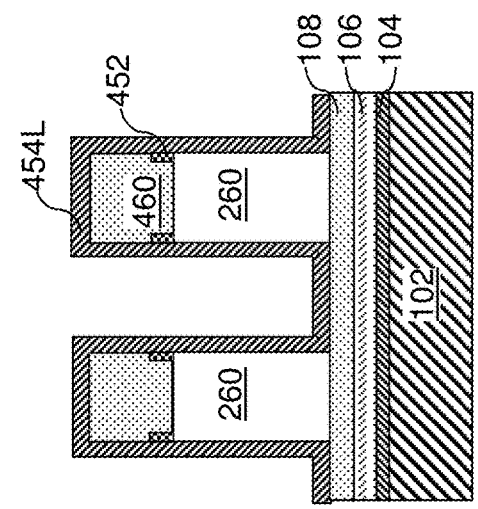
FIGS. 20B-20D are vertical cross-sectional views of the second exemplary structure along the vertical planes B-B', C-C', and D-D' of FIG. 20A.
Figure 20D:
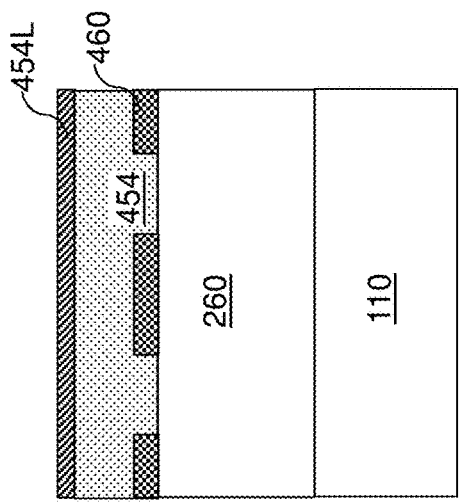
Figure 20A:
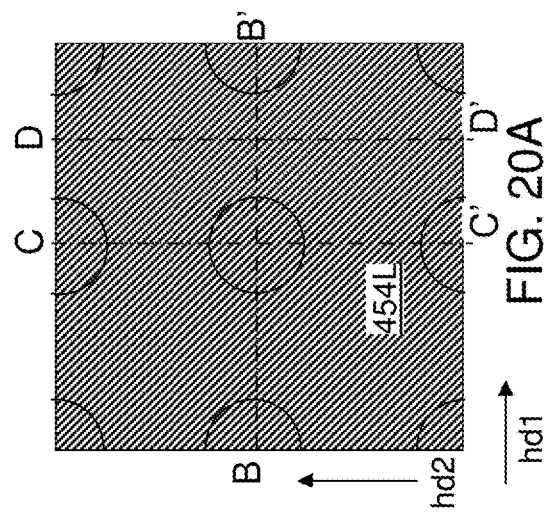
FIG. 20A is a top-down view of the second exemplary structure after deposition of a conformal conductive material layer according to the second embodiment of the present disclosure.
Figure 20B:
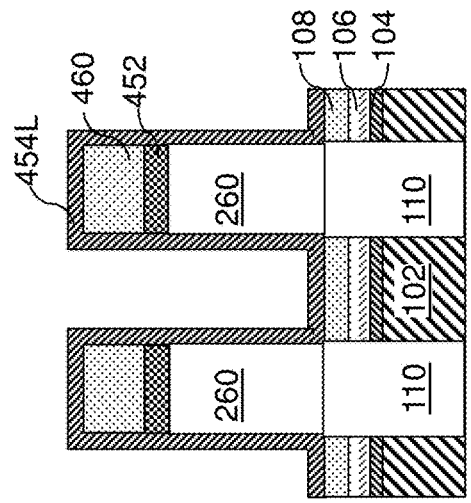
Figure 21A:
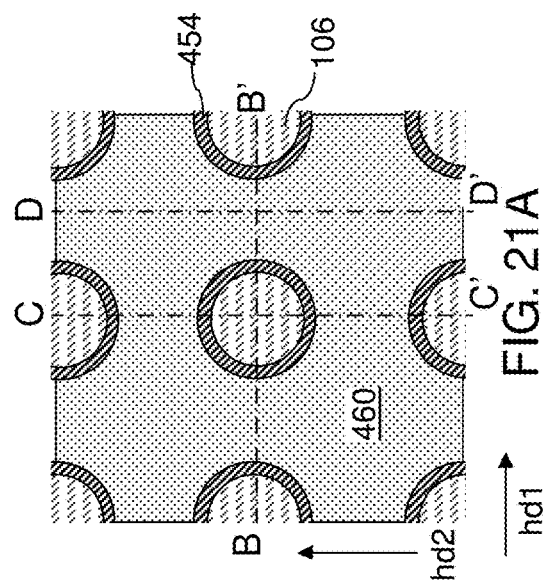
FIG. 21A is a top-down view of the second exemplary structure after formation of tubular gate electrode portions and a two-dimensional array of openings through the planar insulating spacer layer according to the second embodiment of the present disclosure.
Figure 21B:
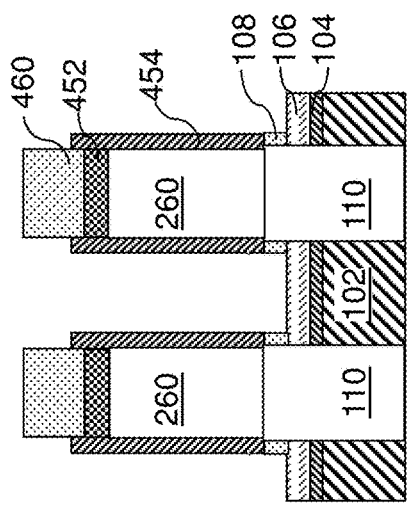
FIGS. 21B-21D are vertical cross-sectional views of the second exemplary structure along the vertical planes B-B', C-C', and D-D' of FIG. 21A.
Figure 21C:
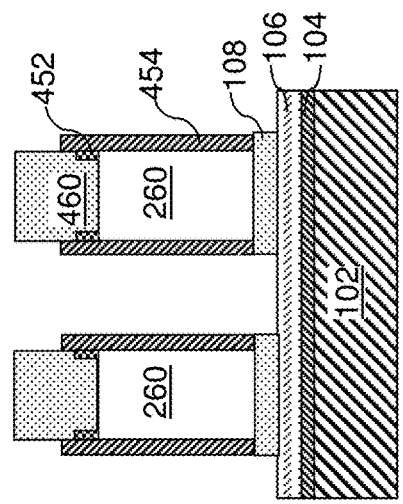
Figure 21D:
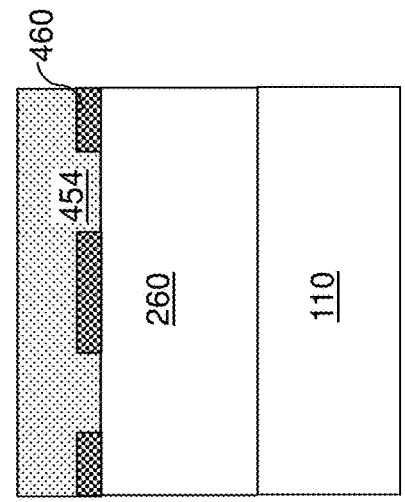

Referring to FIGS. 16A and 16B, a photoresist layer 457 can be applied over the planar gate electrode layer 452L, and can be lithographically patterned to form line trenches that laterally extend along the first horizontal direction hd1. The pattern of the photoresist layer 457 can be the same as the pattern of the gate electrode strips 252 of the first embodiment.

An anisotropic etch can be performed to transfer the pattern of the photoresist layer 457 through the planar gate electrode layer 452L. A top surface of the dielectric matrix layer 260 can be physically exposed within the areas of the openings in the photoresist layer 457. Each remaining portion of the planar gate electrode layer 452L constitutes a gate electrode strip 452, which laterally extends along the first horizontal direction hd1 and has a uniform width along the second horizontal direction hd2. The pattern of the gate electrode strips 452 can be the same as the pattern of the gate electrode strips 252 of the first embodiment.

Referring to FIGS. 17A-17D, a hard mask layer 460 can be formed over the gate electrode strips 452. The hard mask layer 460 includes a dielectric material such as silicon nitride or silicon oxide. The thickness of the hard mask layer 40 can be in range from 10 nm to 100 nm, such as from 20 nm to 60 nm, although lesser and greater thicknesses can also be employed.

Referring to FIGS. 18A-18D, a photoresist layer 267 can be applied over the hard mask layer 460, and can be lithographically patterned to form a two-dimensional array of openings therethrough. In one embodiment, the two-dimensional array of openings can be periodic two-dimensional array having a first periodicity along the first horizontal direction hd1 and having a second periodicity along the second horizontal direction hd2. In one embodiment, the two-dimensional array of openings can be rectangular array or a hexagonal array. Each opening in the patterned photoresist layer 267 can have a substantially same horizontal cross-sectional shape, which can be the shape of a circle, an ellipse, an oval, a rectangle, a hexagon, or any other polygon or a curvilinear shape of a two-dimensional closed shape. In one embodiment, the openings in the patterned photoresist layer 267 can have a shape of a circle or an ellipse. The areas of the openings in the photoresist layer 267 can overlap with the areas of the gate electrode strips 452.

An anisotropic etch process is performed to transfer the pattern in the photoresist layer 267 through the hard mask layer 460 and the gate electrode strips 452. A two-dimensional array of openings having vertical sidewalls is formed through the hard mask layer 460 and the gate electrode strips 452. A top surface of the dielectric matrix layer 260 can be physically exposed at the bottom of each opening in the gate electrode strips 452. A two-dimensional array of openings can be formed through the gate electrode strips 452. In one embodiment, the periphery of each opening through the gate electrode strips 452 can be laterally spaced from the lengthwise sidewalls of the gate electrode strips 452. In other words, the openings of the gate electrode strips 452 do not intersect the lengthwise sidewalls of the gate electrode strips 452, but are formed entirely within the areas of the gate electrode strips 452.

The openings in the photoresist layer 267 can be arranged in various patterns. The pattern of the openings illustrated in FIGS. 18A-18D is a pattern of a periodic rectangular array. FIG. 18E illustrates an exemplary alternative staggered pattern for the openings in the photoresist layer 267, in which the openings in neighboring rows are staggered by half the pitch of a one-dimensional array of openings within each row. Further, the areas of the openings in the photoresist layer 267 can overlap with the areas of the conductive rails 102.

Referring to FIGS. 19A-19D, another anisotropic etch process can be performed to transfer the pattern of the photoresist layer 267 through the dielectric matrix layer 260. The pattern of the photoresist layer 267 is transferred through the dielectric matrix layer 260. A two-dimensional array of openings having vertical sidewalls is formed through hard mask layer 460, the gate electrode strips 452, and the dielectric matrix layer 260. A top surface of the planar insulating spacer layer 108 can be physically exposed at the bottom of each opening in the dielectric matrix layer 260. The shape of each opening can be cylindrical with a horizontal cross-sectional shape that is the same as the horizontal cross-sectional shape of an overlying opening in the photoresist layer 267. The photoresist layer 267 can be subsequently removed, for example, by ashing.

The second exemplary structure includes a stack including doped semiconductor strips 106, a one-dimensional array of gate electrode strips 452, and a dielectric matrix layer 260. The doped semiconductor strips 106 have a first width along the first horizontal direction hd1 and laterally extend along the second horizontal direction hd2. The one-dimensional array of gate electrode strips 452 have a second width along the second horizontal direction hd2 and laterally extend along the first horizontal direction hd1. A two-dimensional array of openings extends through the dielectric matrix layer 260 and the one-dimensional array of gate electrode strips 452.

Referring to FIGS. 20A-20D, a conformal conductive material layer 454L is subsequently deposited on the physically exposed surfaces of the hard mask layer 460, the gate electrode strips 453, and the dielectric matrix layer 260. The conformal conductive material layer 454L includes a conductive material such as a metallic material or a heavily doped semiconductor material. For example, the conformal conductive material layer 454L can include an elemental metal (e.g., tungsten), an intermetallic alloy, and/or a conductive metal nitride such as TiN, TaN, or WN. The conformal conductive material layer 454L can be deposited by a conformal deposition process such as chemical vapor deposition (CVD) or atomic layer deposition (ALD). The thickness of the conformal conductive material layer 454L can be in a range from 5 nm to 100 nm, such as from 10 nm to 50 nm, although lesser and greater thicknesses can also be employed.

Referring to FIGS. 21A-21D, an anisotropic etch process is performed to remove horizontal portions of the conformal conductive material layer 454L from above the top surface of the hard mask layer 460 and at the bottom of each opening in the dielectric matrix layer 260. Remaining vertical portions of the conformal conductive material layer 454L constitute tubular gate electrode portions 454. The anisotropic etch process etches physically exposed portions of the planar insulating spacer layer 108 to form a two-dimensional array of opening therethrough. Portions of the top surface of the doped semiconductor strips 106 are physically exposed.

Each tubular gate electrode portion 454 has a tubular configuration such that an opening vertically extends through the tubular gate electrode portion 454. The inner sidewalls and the outer sidewalls of the tubular gate electrode portions 454 can be vertical. Each outer sidewall of the tubular gate electrode portions 454 can contact a sidewall of a respective one of the gate electrode strips 452. Each gate electrode strip 452 contacts a row of tubular gate electrode portions 454 arranged along the first horizontal direction hd1. In one embodiment, the tubular gate electrode portions 454 can be formed as a two-dimensional array of tubular gate electrode portions 454 in which each of the tubular gate electrode portions 454 is formed directly on a respective one of the gate electrode strips 452. Thus, a two-dimensional array of openings through the dielectric matrix layer 260 and the one-dimensional array of gate electrode strips 452 can be formed by a first anisotropic etch process that forms openings through the dielectric matrix layer 260 and a second anisotropic etch process that precedes the first anisotropic etch and forms openings through the one-dimensional array of gate electrode strips 452.

Referring to FIGS. 22A-22D, a gate dielectric layer and an optional first vertical channel layer 214L can be sequentially formed as in the processing steps of FIGS. 11A-11D. The gate dielectric layer can be formed by conformal deposition of at least one dielectric material, which can include silicon oxide and/or a dielectric metal oxide. The first vertical channel layer includes an intrinsic semiconductor material or a semiconductor material having a doping of a second conductivity type, which is the opposite of the first conductivity type. For example, if the first conductivity type is n-type, the second conductivity type can be p-type, and vice versa. For example, the first vertical channel layer can include doped amorphous silicon or doped polysilicon, and can have a thickness in a range from 3 nm to 100 nm, such as from 6 nm to 50 nm, although lesser and greater thicknesses can also be employed.

An anisotropic etch process can be performed to remove horizontal portions of the first vertical channel layer and the gate dielectric layer. Remaining portions of the gate dielectric layer constitute gate dielectrics 50. The gate dielectrics 50 are formed on inner sidewalls of the tubular gate electrode portions 454. The gate dielectrics 50 can have L-shaped vertical cross-sectional shapes. Each gate dielectric 50 can have a cylindrical portion having an inner vertical sidewall and an outer vertical sidewall, and a horizontal "foot" portion including an opening of a lesser maximum lateral dimension than the maximum lateral dimension (such as the diameter, a major axis, or a diagonal) of the opening of the overlying cylindrical portion. Each remaining portion of the first vertical channel layer constitutes a first vertical channel portion 214. Each first vertical channel portion 214 includes an inner vertical sidewall and an outer vertical sidewall.

Referring to FIGS. 23A-23D, a second vertical channel layer 314 including an intrinsic or doped semiconductor material having a doping of the second conductivity type can be deposited in the openings through the hard mask layer 460, the one-dimensional array of gate electrode strips 452, the dielectric matrix layer 260, and the planar insulating spacer layer 118 by a conformal deposition process. In case the volumes of the openings are not completely filled with the second vertical channel layer, a dielectric core material layer including a dielectric material such as silicon oxide may be deposited in remaining volumes of the openings.

In an alternative embodiment (shown in FIGS. 31A to 33B and described in more detail below), the first vertical channel portion 214 is omitted, and the horizontal portions of the gate dielectric layer 50L are removed to form the gate dielectrics 50 and to expose the underlying doped semiconductor strips 106. The semiconductor channel portion 314 is then formed over the gate dielectrics 50 in contact with the doped semiconductor strips 106.

Materials of the dielectric core material layer (if present) and the second vertical channel layer can be removed from above a horizontal plane including the top surface of the dielectric matrix layer 260 by a planarization process, which can include chemical mechanical planarization and/or a recess etch process. Upper portions of the dielectric matrix layer 260 may be collaterally removed during the planarization process. Each remaining portion of the second vertical channel layer after the planarization process constitutes a second vertical channel portion 314. Each remaining portion of the dielectric core material layer after the planarization process constitutes a dielectric core 62. Each neighboring pair of a first vertical channel portion 214 and a second vertical channel portion 314 constitutes a vertical semiconductor channel 14, which is the channel of a respective vertical field effect transistor. The vertical semiconductor channels 14 are formed within each of the gate dielectrics 50 by deposition of at least one semiconductor material having a doping of the second conductivity type.

Dopants of the first conductivity type can be implanted into upper portions of vertical semiconductor channels 14 to form top active regions 16. Alternatively, the vertical semiconductor channels 14 can be vertically recessed, and a doped semiconductor material having a doping of the first conductivity type can be deposited in the recessed regions to form the top active regions 16. Optionally, the dielectric cores 62 may be vertically recessed prior to depositing the doped semiconductor material having a doping of the first conductivity type, in which case the top active regions 16 are formed on recessed top surfaces of the dielectric cores 62. Thus, the active regions 16 can be formed within, or over, upper portions of the vertical semiconductor channels 14.

Figure 23E:
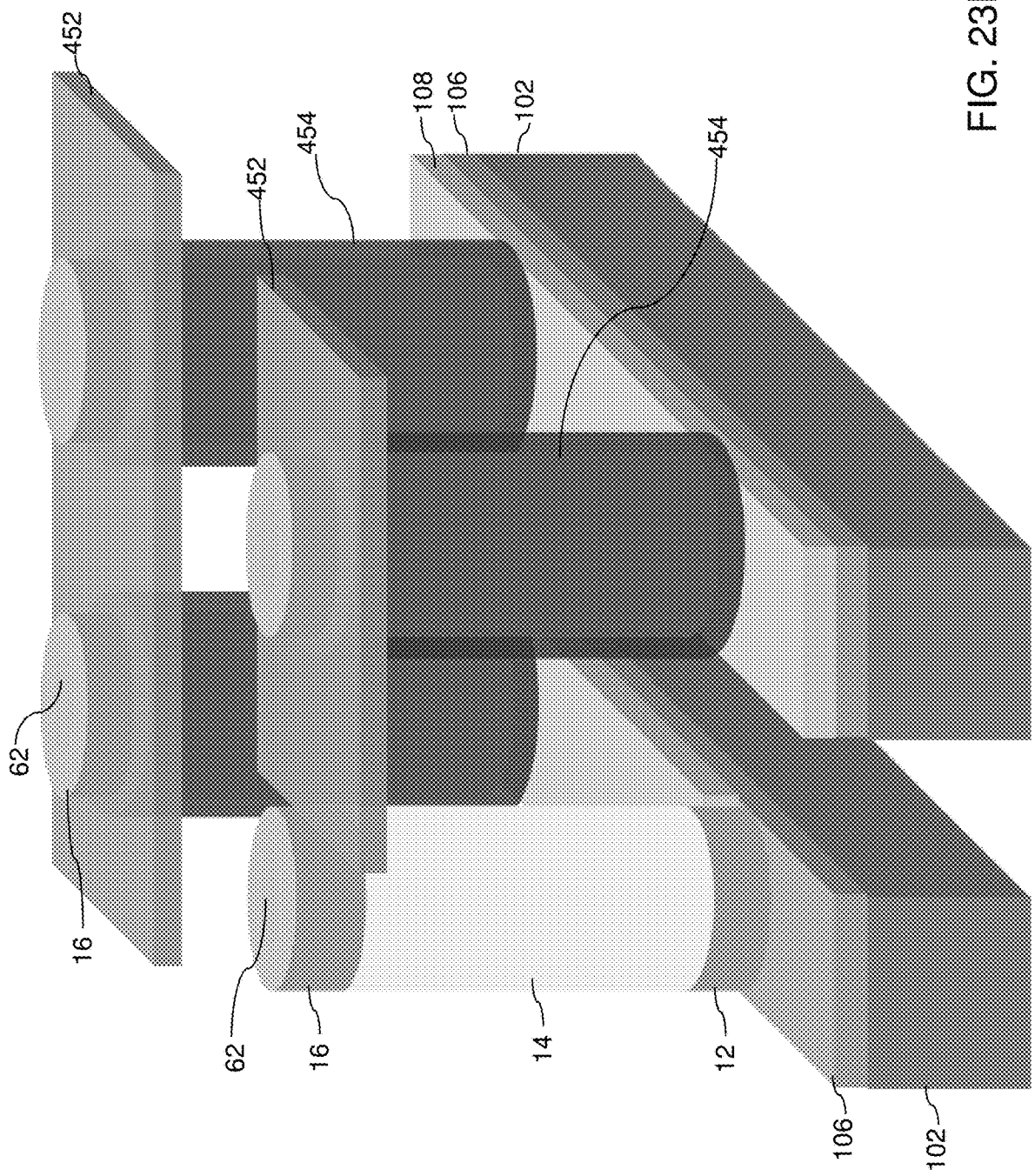
FIG. 23E is a three-dimensional perspective cut-away view of the second exemplary structure of FIG. 23A.

An anneal process can be performed to outdiffuse the dopants of the first conductivity type from the doped semiconductor strips 106 into bottom portions of the vertical semiconductor channels 14. The bottom portions of the vertical semiconductor channels 14 can be converted into semiconductor portions having a doping of the first conductivity type, which constitute bottom active regions 12. Thus, the bottom active regions 12 can be formed diffusing electrical dopants of the first conductivity type from the doped semiconductor strips 106 into lower portions of the vertical semiconductor channels 14. The top active regions 16 and the bottom active regions 12 constitute source regions and drain regions of the vertical field effect transistors. Depending on the mode of operation, the top active regions 16 can function as source regions and the bottom active regions 12 can function as drain regions, or vice versa. FIG. 23E illustrates a three-dimensional perspective cut-away view of the device of FIG. 23A.

In a third embodiment of the present disclosure, a dummy gate can be formed above the surround gate. Referring to FIGS. 24A and 24B, a third exemplary structure according to a third embodiment of the present disclosure can be the same as the first exemplary structure of FIGS. 3A and 3B. A laterally alternating sequence of dielectric separator rails 110 and stacks of a conductive rail 102, and optional metallic nitride strip 104, and a doped semiconductor strip 106 is located over a substrate 8. It is understood that each of the first and second exemplary structures can be formed over the substrate 8.

Figure 5C:
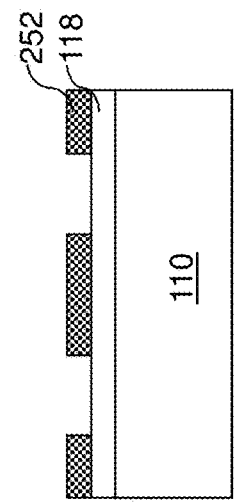
FIGS. 5B-5D are vertical cross-sectional views of the first exemplary structure along the vertical planes B-B', C-C', and D-D' of FIG. 5A.
Figure 5D:
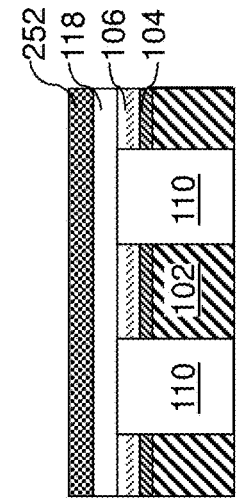
Figure 5A:
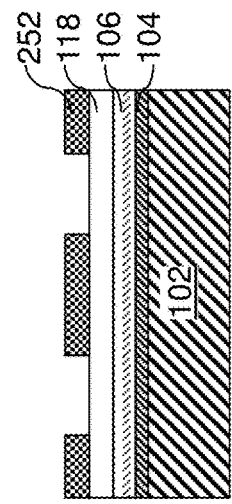
FIG. 5A is a top-down view of the first exemplary structure after patterning the planar gate electrode layer into gate electrode strips according to the first embodiment of the present disclosure.
Figure 5B:
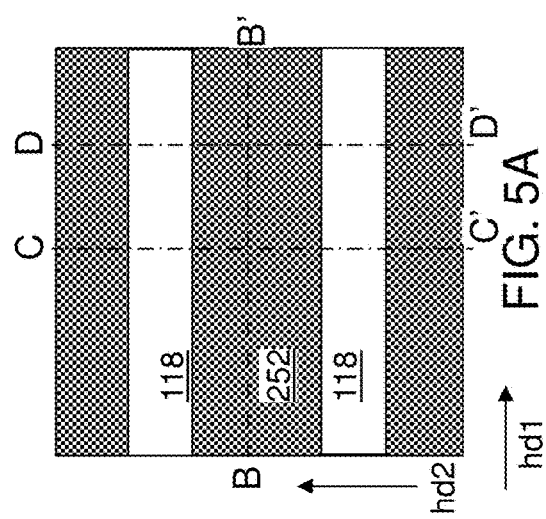
Figure 6C:
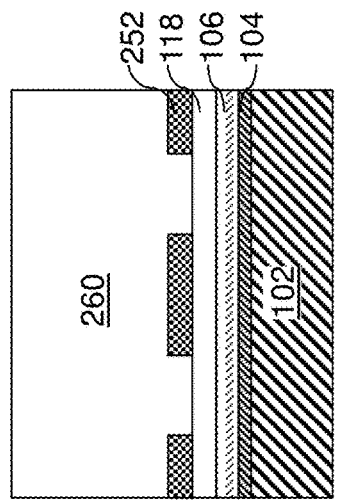
FIGS. 6B-6D are vertical cross-sectional views of the first exemplary structure along the vertical planes B-B', C-C', and D-D' of FIG. 6A.
Figure 6D:
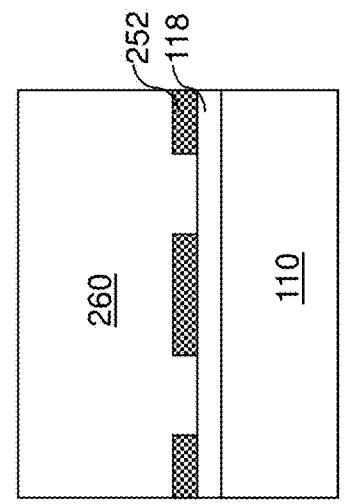
Figure 6A:
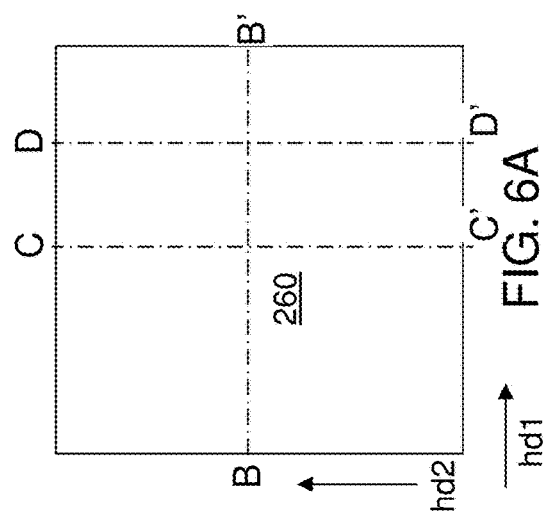
FIG. 6A is a top-down view of the first exemplary structure after formation of a dielectric matrix layer according to the first embodiment of the present disclosure.
Figure 6B:
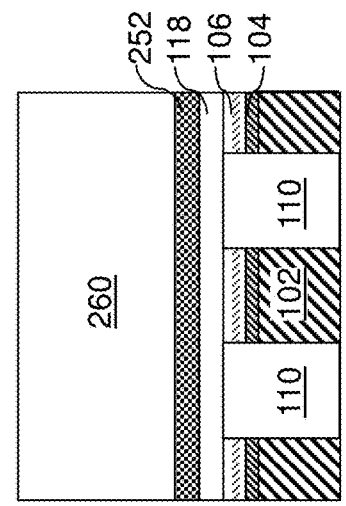

Referring to FIGS. 25A and 25B, the processing steps of FIGS. 4A and 4B and the processing steps of FIGS. 5A-5B can be sequentially performed to form a planar insulating spacer layer 118 and a one-dimensional array of gate electrode strips 252 in the same manner as in the first embodiment.

Figures 26A, 26B:
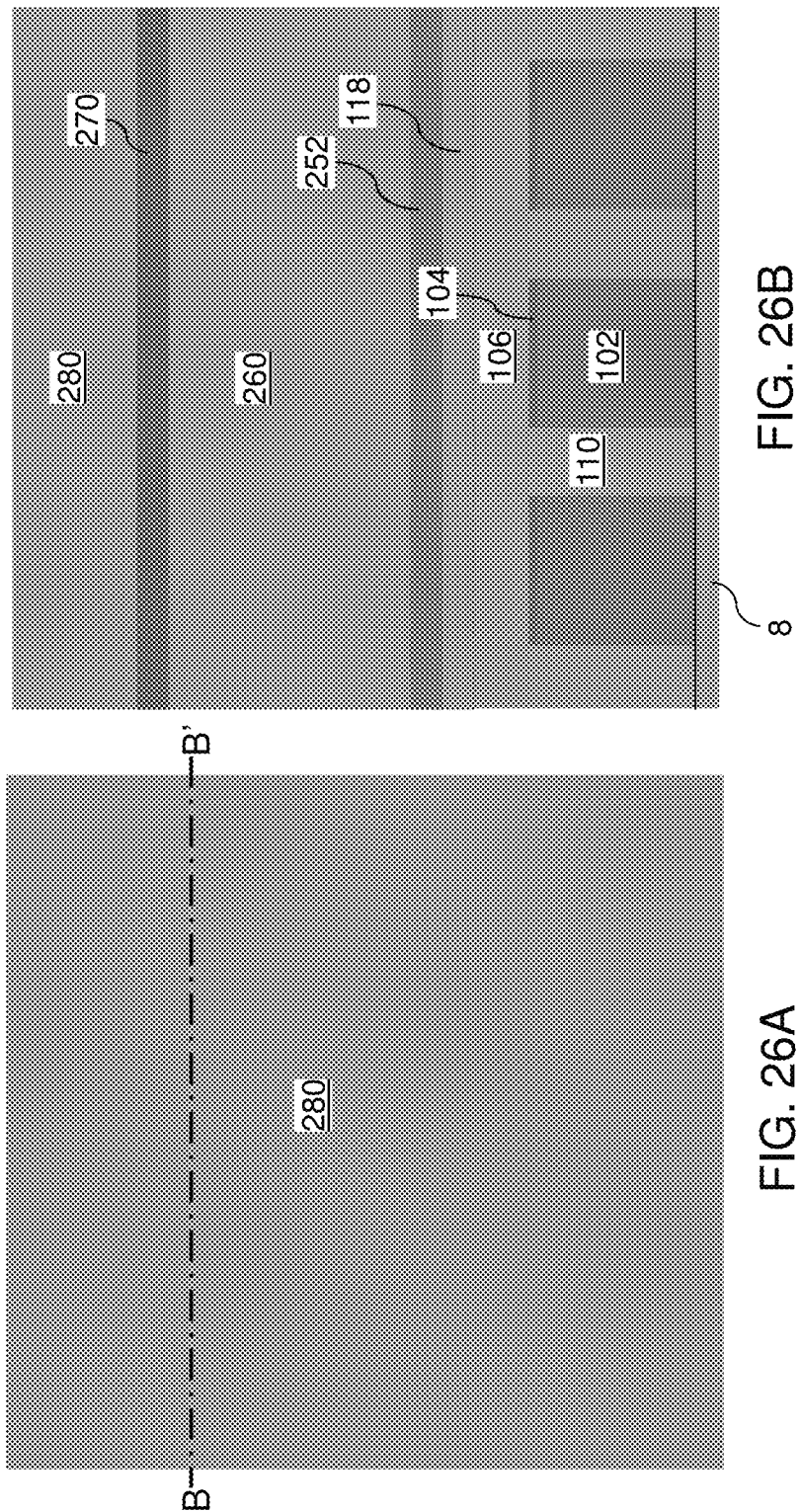
FIG. 26A is a top-down view of the third exemplary structure after formation of a dielectric matrix layer, a dielectric cap layer, and a dielectric template layer according to the third embodiment of the present disclosure.
FIG. 26B is a vertical cross-sectional view of the third exemplary structure along the vertical plane B-B' of FIG. 26A.
Figure 38D:
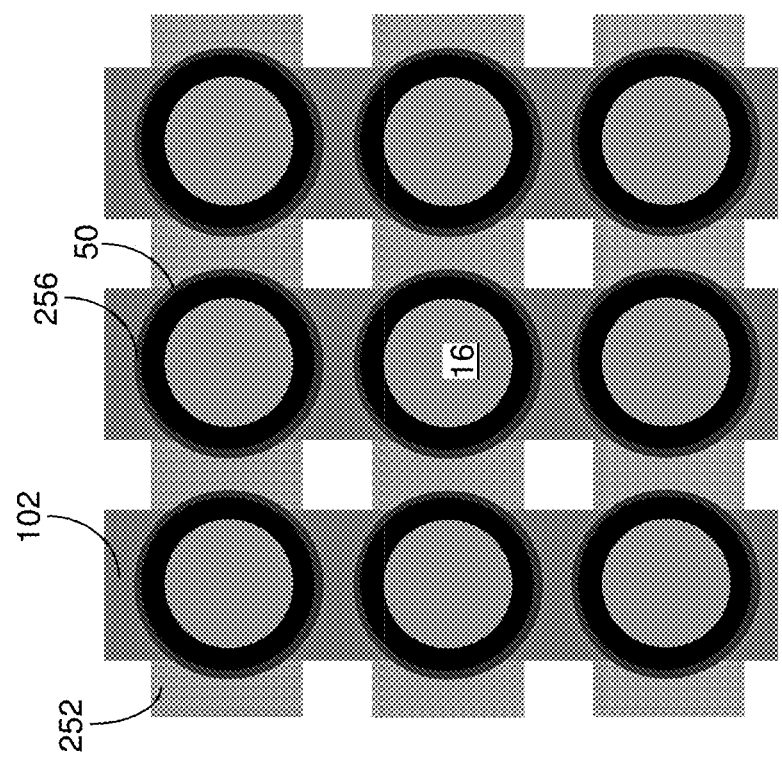
FIG. 38D is a top-down cut-away view of the third exemplary structure of FIG. 38A.
Figure 38C:
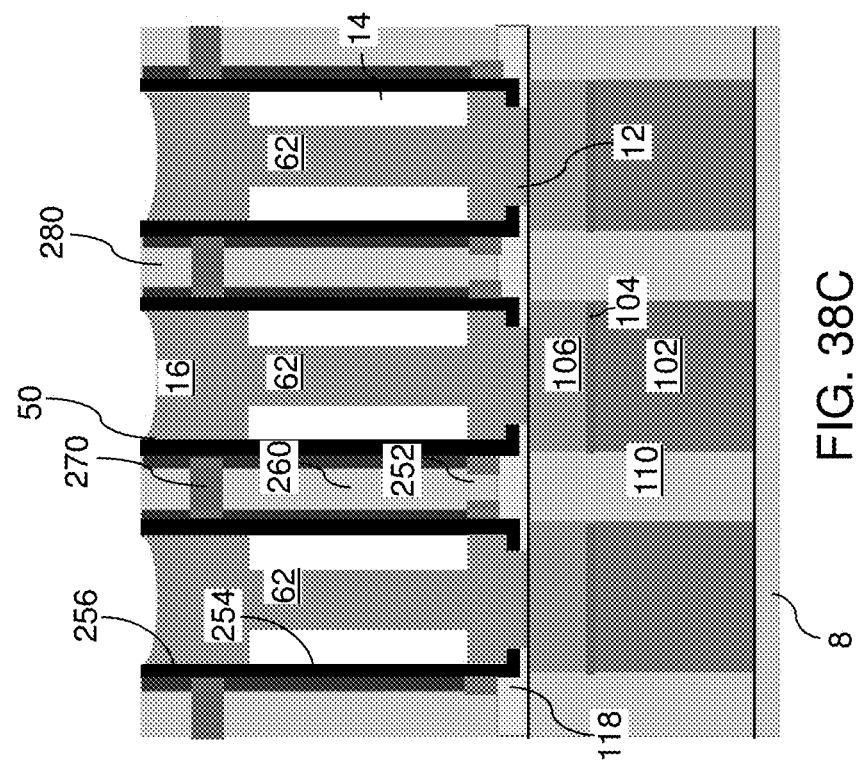

Referring to FIGS. 26A and 26B, a dielectric matrix layer 260, a dielectric cap layer 270, and a dielectric template layer 280 can be sequentially deposited over the one-dimensional array of gate electrode strips 252. The dielectric matrix layer 260 can have the same composition and thickness as the dielectric matrix layer 260 of the first embodiment.

The dielectric cap layer 270 includes a dielectric material that is different from the dielectric material of the dielectric matrix layer 260. For example, if the dielectric matrix layer 260 includes silicon oxide, the dielectric cap layer 270 can include silicon nitride or a dielectric metal oxide. The thickness of the dielectric cap layer 270 can be in a range from 10 nm to 100 nm, such as from 20 nm to 50 nm, although lesser and greater thicknesses can also be employed.

The dielectric template layer 280 includes a dielectric material that can be etched selective to the dielectric material of the dielectric cap layer 270. For example, the dielectric template layer 280 can include silicon oxide, doped silicate glass, or organosilicate glass. The thickness of the dielectric template layer 270 can be in a range from 20 nm to 200 nm, such as from 40 nm to 100 nm, although lesser and greater thicknesses can also be employed.

The third exemplary structure comprises a stack including doped semiconductor strips 106, a one-dimensional array of gate electrode strips 252, a dielectric matrix layer 260, a dielectric cap layer 270 and a dielectric template layer 280. The doped semiconductor strips 106 have a first width along the first horizontal direction hd1 and laterally extend along the second horizontal direction hd2. The one-dimensional array of gate electrode strips 252 have a second width along the second horizontal direction hd2 and laterally extend along the first horizontal direction hd1.

Referring to FIGS. 27A and 27B, a photoresist layer (not shown) can be applied over the dielectric template layer 280, and can be lithographically patterned to form a two-dimensional array of openings. The pattern of the two-dimensional array of openings in the photoresist layer can be any of the patterns of the two-dimensional array of openings that can be formed in the photoresist layer 267 at the processing steps of FIGS. 7A-7E or at the processing steps of FIGS. 18A-18E in the first or second embodiment. In one embodiment, physically exposed horizontal surfaces of the gate electrode strips 252 can be vertically recessed below a horizontal plane including the interface between the unrecessed top surfaces of the gate electrode strips 252 and the dielectric matrix layer 260.

The pattern of the openings in the photoresist layer can be transferred through the dielectric template layer 280, the dielectric cap layer 270, and the dielectric matrix layer 260 by an isotropic etch process. A two-dimensional array of openings having vertical sidewalls can be formed through the stack of the dielectric template layer 280, the dielectric cap layer 270, and the dielectric matrix layer 260.

Referring to FIGS. 28A and 28B, an isotropic etch process is performed to recess surfaces of the dielectric template layer 280 and the dielectric matrix layer 260 selective to the dielectric cap layer 270. The isotropic etch process can be a wet etch process that etches the materials of the dielectric template layer 280 and the dielectric matrix layer 260 selective to the material of the dielectric cap layer 270. In an illustrative example, the dielectric template layer 280 and the dielectric matrix layer 260 can include silicon oxide, and the dielectric cap layer 270 can include silicon nitride. In this case, a wet etch employing hydrofluoric acid can be employed to recess the silicon oxide materials of the dielectric template layer 280 and the dielectric matrix layer 260 selective to the silicon nitride material of the dielectric cap layer 270. The recess distance can be the same as, or greater than, the thickness of a conformal conductive material layer that is subsequently deposited to pattern tubular gate electrode portions. For example, the recess distance can be in a range from 10 nm to 150 nm, such as from 20 nm to 75 nm, although lesser and greater recess distances can also be employed. An annular portion of the dielectric cap layer 270 protrudes inward from the periphery of each opening through the stack of the dielectric template layer 280, the dielectric cap layer 270, and the dielectric matrix layer 260.

Referring to FIGS. 29A and 29B, a conformal conductive material layer 254L can be deposited by a conformal deposition method such as chemical vapor deposition (CVD) or atomic layer deposition (ALD). The conformal conductive material layer 254L can have the same composition and thickness as the conformal conductive material layer 252 of the first embodiment.

Referring to FIGS. 30A and 30B, an anisotropic etch is performed to remove horizontal portions of the conformal conductive material layer 254L. The anisotropic etch can continue to etch through portions of the gate electrode strips 252 that underlie the openings through the dielectric matrix layer 260. The planar insulating cap layer 118 can be partially etched during the anisotropic etch process. The two-dimensional array of openings through the dielectric matrix layer 260 can be vertically extended through the gate electrode strips 252. Thus, a two-dimensional array of openings can be formed through the dielectric matrix layer 260 and the one-dimensional array of gate electrode strips 252.

Each remaining vertical portion of the conformal conductive material layer 254L underneath the inward protrusions of the dielectric cap layer 270 constitutes tubular gate electrode portions 254. Each tubular gate electrode portion 254 can be formed directly on a recessed horizontal surface and a sidewall surface of a gate electrode strip 252. The two-dimensional array of tubular gate electrode portions 254 is formed in laterally recessed regions of the two-dimensional array of openings that underlie laterally protruding portions of the dielectric cap layer 270. The interface between the dielectric cap layer 270 and the dielectric matrix layer 260 defines the height of the top surfaces of the tubular gate electrode portions 254. Thus, the top surfaces of the tubular gate electrode portions 254 are self-aligned to the height of the top surface of the dielectric matrix layer 260, and the vertical extent of the tubular gate electrode portions 254 can be precisely controlled in a manner that is independent of the etch rate of the conformal conductive material layer 254L during the anisotropic etch process.

The vertically recessed horizontal surfaces and the sidewalls of the gate electrode strips 252 can collectively increase the total contact area between the tubular gate electrode portions 254 and the gate electrode strips 252 relative to a configuration in which only bottom surfaces of the tubular gate electrode portions 254 contact top surfaces of the gate electrode strips 252. A two-dimensional array of tubular gate electrode portions 254 can be formed in the two-dimensional array of openings through the dielectric matrix layer 260. Each of the tubular gate electrode portions 254 is formed directly on a respective one of the gate electrode strips 252.

A conductive annular structure (i.e., a dummy gate) 256 including the same material as, and having the same thickness as, the tubular gate electrode portions 254 can be formed above each lateral protrusion of the dielectric cap layer 270. The conductive annular structure 256 can have substantially the same horizontal cross-sectional shape as the underlying tubular gate electrode portion 254. Optionally, the conductive annular structures 256 may be removed by extending the duration of the anisotropic etch process. Alternatively, a two-dimensional array of conductive annular structures 256 may remain in the completed third exemplary structure.

Referring to FIGS. 31A and 31B, a gate dielectric layer 50L and a cover material layer 53L can be deposited by conformal deposition methods. The gate dielectric layer 50L can have the same composition and thickness as the gate dielectric layer 50L of the first and second embodiments. The cover material layer 53L includes a sacrificial material that can be removed selective to the material of the gate dielectric layer 50L. For example, the cover material layer 53L can include silicon nitride, amorphous silicon, polysilicon, amorphous carbon, diamond-like carbon (DLC), or a silicon-containing polymer. The thickness of the cover material layer 53L can be in a range from 5 nm to 50 nm, although lesser and greater thicknesses can also be employed.

Referring to FIGS. 32A and 32B, an anisotropic etch is performed to etch horizontal portions of the cover material layer 53L and the gate dielectric layer 50L, and to etch portions of the planar insulating cap layer 118 that underlie the two-dimensional array of openings through the dielectric matrix layer 260 and the one-dimensional array of gate electrode strips 252. Portions of the top surfaces of the doped semiconductor strips 106 are physically exposed underneath a two-dimensional array of openings through the planar insulating cap layer 118. Each remaining portion of the gate dielectric layer 50L constitutes a gate dielectric 50. The gate dielectrics 50 are formed on inner sidewalls of the tubular gate electrode portions 254. The gate dielectrics 50 can have L-shaped vertical cross-sectional shapes. Each gate dielectric 50 can have a cylindrical portion having an inner vertical sidewall and an outer vertical sidewall, and a horizontal "foot" portion including an opening of a lesser maximum lateral dimension than the maximum lateral dimension (such as the diameter, a major axis, or a diagonal) of the opening of the overlying cylindrical portion. Remaining portions of the cover material layer 53L can be removed selective to the gate dielectrics 50.

Referring to FIGS. 33A and 33B, a vertical channel layer 14L including a doped semiconductor material having a doping of the second conductivity type (which is the opposite of the first conductivity type) can be deposited in the openings through the dielectric template layer 280, the dielectric cap layer 270, the dielectric matrix layer 260, the one-dimensional array of gate electrode strips 252, and the planar insulating spacer layer 118 by a conformal deposition process. In case the volumes of the openings are not completely filled with the vertical channel layer 14L, a dielectric core material layer 62L including a dielectric material such as silicon oxide may be deposited in remaining volumes of the openings.

Referring to FIGS. 34A and 34B, the dielectric core material layer 62L can be recessed such that top surfaces of remaining portions of the dielectric core material layer 62L are recessed below a horizontal plane including the top surface of the dielectric template layer 280. Each remaining portion of the dielectric core material layer 62L constitutes a dielectric core 62.

Referring to FIGS. 35A and 35B, portions of the vertical channel layer 14L can be removed from above the horizontal plane including the top surfaces of the dielectric cores 62 by an etch process, which can include an isotropic etch process or an anisotropic etch process. Each remaining portion of the vertical channel layer 14L constitutes a vertical semiconductor channel 14.

Referring to FIGS. 36A and 36B, a doped semiconductor material layer 16L having a doping of the first conductivity type can be deposited in the recessed regions overlying the dielectric cores 62 and the vertical semiconductor channels 14 by a conformal or non-conformal deposition process. The doped semiconductor material layer 16L may be formed within in-situ doping with dopants of the first conductivity type. Alternatively, an undoped or doped semiconductor material layer can be deposited and dopants of the first conductivity type can be subsequently implanted to form the doped semiconductor material layer 16L.

Referring to FIGS. 37A and 37B, an anneal process is performed at an elevated temperature to induce outdiffusion of electrical dopants from the doped semiconductor strips 106. Lower portions of the vertical semiconductor channels 14 can be converted into bottom active regions 12 having a doping of the first conductivity type by the anneal process. Further, upper portions of the vertical semiconductor channels 14 can be converted into regions having a doping of the first conductivity type during the anneal process.

Referring to FIGS. 38A-38D, a planarization process such as a recess etch and/or chemical mechanical planarization (CMP) can be performed to remove portions of the doped semiconductor material layer 16L from above the horizontal plane including the top surface of the dielectric template layer 280. Remaining portions of the doped semiconductor material layer 16L having a doping of the first conductivity type and located over the vertical semiconductor channels 14 constitute top active regions 16. Each top active region 16 can be laterally surrounded by a gate dielectric 50, which can be laterally surrounded by a conductive annular structure 256. Each conductive annular structure 256 is electrically isolated from an underlying tubular gate electrode portion 254 by the dielectric cap layer 270.

Figure 39A:
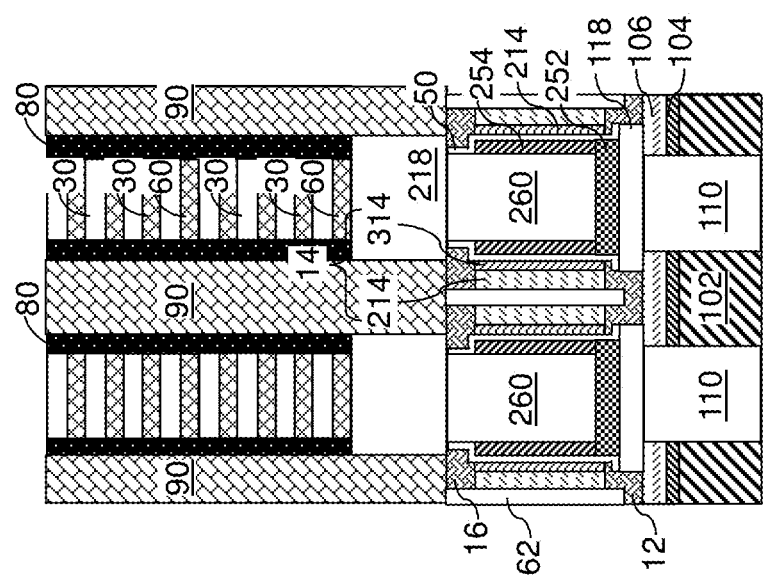
Figure 39C:
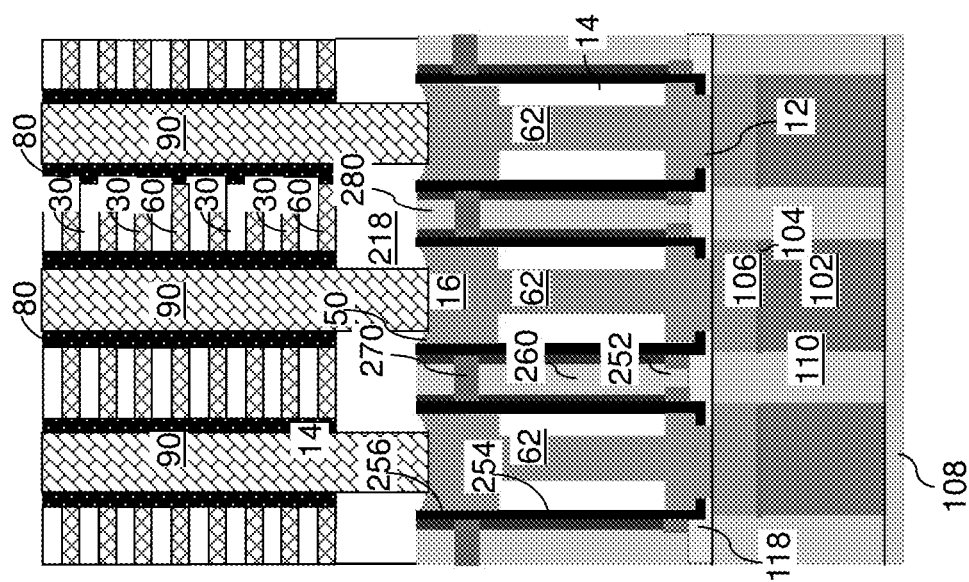

Referring to FIGS. 39A, 39B, and 39C, a three-dimensional memory array can be formed on any of the first, second, and third exemplary structures described above. For example, an insulating spacer layer 218 can be formed on any of the first, second, and third exemplary structures. A plurality of alternating stacks (30, 60) of insulating strips 60 and electrically conductive strips 30 can be formed over the two-dimensional array of vertical field effect transistors of the exemplary structures described above. Each layer within an alternating stack (30, 60), i.e., each of the insulating strips 60 and the electrically conductive strips (e.g., word lines) 30 in the alternating stack (30, 60), can laterally extend along a horizontal direction, which may be selected from the first horizontal direction hd1 and the second horizontal direction hd2. Each neighboring pair of alternating stacks (30, 60) can be laterally spaced from each other by a line trench. The line trenches can form a one-dimensional array that is repeated along a horizontal direction that is perpendicular to the horizontal direction along which the layers within each alternating stack (30, 60) laterally extend. The line trenches can be filled with a two-dimensional array of dielectric pillar structures that defines a two-dimensional array of pillar cavities (i.e., cavities having a respective pillar shape). Each pillar cavity is laterally bounded by a neighboring pair of alternating stacks (30, 60) along one horizontal direction, and is laterally bounded by a neighboring pair of dielectric pillar structures along another horizontal direction.

Resistive memory elements 80 can be formed on the sidewalls of the pillar cavities, i.e., on the sidewalls of the plurality of alternating stacks (30, 60). The resistive memory element 80 material may be selected from: (i) a non-filamentary barrier modulated cell (BMC) which includes a barrier and an electrically conductive metal oxide whose resistivity is switched by at least one of oxygen ion and/or oxygen vacancy diffusion in response to an application of an electric field thereto; (ii) a phase change material portion providing at least two different levels of resistivity that depend on crystallinity; or (iii) a filamentary metal oxide portion (e.g., hafnium oxide layer) providing at least two different levels of resistivity depending on concentration of conductive filaments therein.

Each BMC can include a metal oxide material having at least two resistive states having different resistivity. Examples of metal oxide materials include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0 \times 10^{20}/cm^3$ to $1.0 \times 10^{21}/cm^3$. The memory cell may also include a barrier material, such as amorphous silicon or other suitable barrier materials. An interfacial barrier oxide is located between the metal oxide material and the barrier material. For an amorphous silicon barrier material, the interfacial barrier oxide may comprise silicon oxide.

Without wishing to be bound by a particular theory, it is believed that the BMC ReRAM device operates as follows. The switching mechanism in BMC stack is generally understood as oxygen interstitial (Oi) generation in the interfacial barrier oxide (e.g., $SiO_2$) at the amorphous silicon (a-Si)/$TiO_{2-\delta}$ interface after a RESET operation (i.e., resetting the stack into the high resistivity state, HRS). The oxygen interstitials may drift into defect rich $TiO_{2-\delta}$ where they cause a re-oxidation of the $TiO_{2-\delta}$ (e.g., recombine with oxygen vacancies in the $TiO_{2-\delta}$ near the interface. This re-oxidation decreases the conductivity of the $TiO_{2-\delta}$ material and/or increases the thickness of the insulating interfacial barrier oxide and hence increases the resistance of the BMC memory cell. During the SET operation, opposite voltage is applied across the cell, and Ti—O bonds are supposed to be broken down to generate Oi and Vo (oxygen vacancy) pair in the titanium oxide layer. Oi may drift back to the a-Si/$TiO_{2-\delta}$ interface along the electric field to increase the conductivity of the $TiO_{2-\delta}$ layer and/or decrease the thickness of the insulating interfacial barrier oxide and hence decrease the resistance of the BMC memory cell to set the memory cell into the low resistivity state, LRS.

Without wishing to be bound by a particular theory, it is believed that a BMC ReRAM device may operate based on the principle described above and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide.

Optionally, the resistive memory element 80 may also include an optional steering element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction).

Vertical bit lines (e.g., local bit lines) 90 can be formed in remaining volumes of the pillar cavities. The local bit lines are electrically connected to the conductive rails (e.g., global bit lines 102) through the select transistors (12, 14, 16, 254/454). The select transistor gate electrodes (254, 454) are connected to the respective select gate lines (252, 452) which function as conductive bridges between the select transistor gate electrodes. Each vertical bit line 90 can electrically contact a respective one of the top active regions 16, and can be formed between a respective neighboring pair of alternating stacks (30, 60) among the plurality of alternating stacks (30, 60). In one embodiment, the structure formed above the two-dimensional array of vertical field effect transistors can include a three-dimensional array of resistive random access memory (ReRAM) devices.

Generally, resistive memory elements of a resistive random access memory device can be formed on sidewalls of the plurality of alternating stacks (30, 60). Vertical local bit lines 90 contacting a respective one of the top active regions 16 can be formed between a respective neighboring pair of alternating stacks (30, 60) among the plurality of alternating stacks (30, 60).

Referring generally to all of the figures of the present disclosure, a semiconductor structure comprising a two-dimensional array of vertical field effect transistors is provided according to various embodiments of the present disclosure. The two-dimensional array of vertical field effect transistors can comprise: a one-dimensional array of gate electrode strips (252, 452) laterally extending along a first horizontal direction hd1 and laterally spaced apart along a second horizontal direction hd2, wherein each of the gate electrode strips (252, 452) comprises openings arranged along the first horizontal direction hd1; a two-dimensional array of tubular gate electrode portions (254, 454) located on the one-dimensional array of gate electrode strips (252, 452); a gate dielectric 50 located inside each of the tubular gate electrode portions (254, 454); and a vertical semiconductor channel 14 extending along a vertical direction located inside each of the tubular gate electrode portions (254, 454) and laterally surrounded by the respective gate dielectric 50.

In one embodiment, each of the tubular gate electrode portions (254, 454) includes an opening that overlies, or underlies, a respective opening in the gate electrode strips (252, 452). A periphery of each opening in the gate electrode strips (252, 452) is vertically coincident with a sidewall of a respective one of the tubular gate electrode portions (254, 454). As used herein, two surfaces are "vertically coincident" with each other if there the two surfaces overlie or underlie each other and if there exists a vertical plane including the two surfaces.

In one embodiment, each of the tubular gate electrode portions 254 includes an annular bottom surface that contacts a top surface of a respective one of the gate electrode strips 252.

In one embodiment, each of the tubular gate electrode portions (254, 454) includes an outer sidewall that contacts a sidewall of a respective one of the openings in the gate electrode strips (252, 452).

In one embodiment, the semiconductor structure further comprises a dielectric matrix layer 260 laterally including a two-dimensional array of pillar cavities (i.e., openings having pillar shapes) therein, wherein each of the tubular gate electrode portions (254, 454) is located within a respective one of the two-dimensional array of pillar cavities. In one embodiment, each of the gate electrode strips 252 underlies the dielectric matrix layer 260 and contacts bottom parts of a set of tubular gate electrode portions 254. In another embodiment, each of the gate electrode strips 452 overlies the dielectric matrix layer 260 and contacts top parts of a set of tubular gate electrode portions 454. The gate electrode strips (252, 452) are thinner in the vertical direction (i.e., perpendicular to the top surface of the substrate) than the tubular gate electrode portions (254, 454).

In one embodiment, an outer sidewall of each of the tubular gate electrode portions (254, 454) contacts a respective sidewall of the dielectric matrix layer 260. In one embodiment, sidewalls of the openings in the gate electrode strips (252, 452) are vertically coincident with sidewalls of the dielectric matrix layer 260.

In one embodiment, the semiconductor structure further comprises a two-dimensional array of annular conductive structures 256 that overlies, and electrically isolated from, the two-dimensional array of tubular gate electrode portions 254.

In one embodiment, the semiconductor structure further comprises: top active regions 16 located at an upper end of a respective one of the vertical semiconductor channels 14; and bottom active regions 12 located at a lower end of a respective one of the vertical semiconductor channels 14. In one embodiment, the semiconductor structure further comprises doped semiconductor strips 106 having a doping of a same conductivity type as the bottom active regions 12, contacting a respective column of the bottom active regions 12 that are arranged along the second horizontal direction hd2, and laterally spaced among one another along the first horizontal direction hd1. In one embodiment, each of the bottom active regions 12 comprises: an upper portion overlying a horizontal portion of a respective one of the gate dielectrics 50; and a lower portion contacting sidewalls of the horizontal portion of the respective one of the gate dielectrics 50 and having a lesser area than the upper portion.

In one embodiment, the semiconductor structure further comprises an alternating sequence of global bit line conductive rails (102, 104) and dielectric separator rails 110 that alternate along the second horizontal direction hd2, wherein each of the global bit line conductive rails (102, 104) is electrically connected to a respective column of bottom active regions 12 that are arranged along the second horizontal direction hd2.

In one embodiment, the semiconductor structure further comprises a resistive random access memory (ReRAM)

device located over the two-dimensional array of vertical field effect transistors. The ReRAM device comprises: a plurality of alternating stacks of insulating strips 60 and electrically conductive word line strips 30 overlying the two-dimensional array of vertical field effect transistors; vertical local bit lines 90 electrically contacting a respective one of the top active regions 16 and vertically extending between a respective neighboring pair of alternating stacks among the plurality of alternating stacks; and resistive memory elements 80 located at each intersection between the vertical local bit lines 90 and the plurality of alternating stacks (30, 60).

According to another embodiment, a semiconductor structure comprises a plurality of vertical semiconductor channel pillars 14 extending in a vertical direction perpendicular to a top surface of a substrate 8, bottom 12 and top 16 active regions contacting respective bottom and top ends of the vertical semiconductor pillars 14, gate dielectrics 50 surrounding respective vertical semiconductor channel pillars 14, gate electrodes (254, 454) surrounding respective gate dielectrics 50 and vertical semiconductor channel pillars 14, and gate electrode strips (252, 452) which are thinner than the gate electrodes (254, 454) in the vertical direction. Each gate electrode strip (252, 452) contacts one of top or bottom parts of a plurality of the gate electrodes (254, 454).

The vertical semiconductor channels 14 of the vertical field effect transistors can be located entirely within a respective one of the tubular gate electrode portions (254, 454). As such, each vertical field effect transistor includes a respective surround gate providing increased channel width and on current as well as enhanced control of channel mobility compared to vertical field effect transistors including only a pair of gate electrodes on respective two sidewalls of a rectangular semiconductor channel. Further, the vertical field effect transistors including the surrounding gates can provide enhanced sub-threshold voltage characteristics, thereby improving many device characteristics for a three-dimensional memory device. Still further, by forming the semiconductor channel 14 inside the tubular gate electrode portions (254, 454) provides a thin polysilicon channel with small grain size for an improved device on current.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
   a two-dimensional array of vertical field effect transistors, wherein the two-dimensional array of vertical field effect transistors comprises:
   a one-dimensional array of gate electrode strips laterally extending along a first horizontal direction and laterally spaced among one another along a second horizontal direction, wherein each of the gate electrode strips comprises openings arranged along the first horizontal direction;
   a two-dimensional array of tubular gate electrode portions located on the one-dimensional array of gate electrode strips, wherein each of the tubular gate electrode portions includes an opening that overlies, or underlies, a respective opening in the gate electrode strips;
   a gate dielectric located inside each of the tubular gate electrode portions;
   a vertical semiconductor channel extending along a vertical direction and located inside each of the tubular gate electrode portions and laterally surrounded by the gate dielectric; and
   bottom and top active regions contacting respective bottom and top ends of the vertical semiconductor channel;
   an alternating sequence of global bit line conductive rails and dielectric separator rails that alternate along the second horizontal direction, wherein each of the global bit line conductive rails is electrically connected to a respective column of the bottom active regions that are arranged along the second horizontal direction; and
   a resistive random access memory (ReRAM) device located over the two-dimensional array of vertical field effect transistors, the ReRAM device comprising:
   a plurality of alternating stacks of insulating strips and electrically conductive word line strips overlying the two-dimensional array of vertical field effect transistors;
   vertical local bit lines electrically contacting a respective one of the top active regions and vertically extending between a respective neighboring pair of alternating stacks among the plurality of alternating stacks; and
   resistive memory elements located at each intersection between the vertical local bit lines and the plurality of alternating stacks.

2. The semiconductor structure of claim 1, wherein a periphery of each opening in the gate electrode strips is vertically coincident with a sidewall of a respective one of the tubular gate electrode portions.

3. The semiconductor structure of claim 1, wherein each of the tubular gate electrode portions includes an annular bottom surface that contacts a top surface of a respective one of the gate electrode strips.

4. The semiconductor structure of claim 1, wherein each of the tubular gate electrode portions includes an outer sidewall that contacts a sidewall of a respective one of the openings in the gate electrode strips.

5. The semiconductor structure of claim 1, further comprising a dielectric matrix layer laterally including a two-dimensional array of pillar cavities therein, wherein each of the tubular gate electrode portions is located within a respective one of the two-dimensional array of pillar cavities.

6. The semiconductor structure of claim 5, wherein each of the gate electrode strips underlies the dielectric matrix layer and contacts bottom parts of a set of tubular gate electrode portions.

7. The semiconductor structure of claim 5, wherein an outer sidewall of each of the tubular gate electrode portions contacts a respective sidewall of the dielectric matrix layer.

8. The semiconductor structure of claim 5, wherein sidewalls of the openings in the gate electrode strips are vertically coincident with sidewalls of the dielectric matrix layer.

9. The semiconductor structure of claim 1, further comprising a two-dimensional array of annular conductive structures that overlies, and electrically isolated from, the two-dimensional array of tubular gate electrode portions.

10. The semiconductor structure of claim 1, further comprising:
   a top active region located at an upper end of the vertical semiconductor channel; and
   a bottom active region located at a lower end of the vertical semiconductor channel.

11. The semiconductor structure of claim 10, further comprising doped semiconductor strips having a doping of a same conductivity type as the bottom active regions, contacting a respective column of the bottom active regions that are arranged along the second horizontal direction, and laterally spaced among one another along the first horizontal direction.

12. The semiconductor structure of claim 10, wherein each of the bottom active regions comprises:
   an upper portion overlying a horizontal portion of a respective gate dielectric; and
   a lower portion contacting sidewalls of the horizontal portion of the respective gate dielectric and having a lesser area than the upper portion.

13. A semiconductor structure, comprising:
   a plurality of vertical semiconductor channel pillars extending in a vertical direction perpendicular to a top surface of a substrate;
   bottom and top active regions contacting respective bottom and top ends of the vertical semiconductor pillars;
   gate dielectrics surrounding respective vertical semiconductor channel pillars;
   gate electrodes surrounding respective gate dielectrics and vertical semiconductor channel pillars;
   gate electrode strips which are thinner than the gate electrodes in the vertical direction, wherein each gate electrode strip contacts one of top or bottom parts of a plurality pluratity of the gate electrodes;
   global bit lines electrically connected to the bottom active regions; and
   a resistive random access memory (ReRAM) device located over the top active regions, the ReRAM device comprising:
      a plurality of alternating stacks of insulating strips and electrically conductive word line strips overlying the two-dimensional array of vertical field effect transistors;
      vertical local bit lines electrically contacting a respective one of the top active regions and vertically extending between a respective neighboring pair of alternating stacks among the plurality of alternating stacks; and
      resistive memory elements located at each intersection between the vertical local bit lines and the plurality of alternating stacks.

\* \* \* \* \*